(12) United States Patent
Okano

(10) Patent No.: US 9,530,839 B2
(45) Date of Patent: Dec. 27, 2016

(54) SEMICONDUCTOR DEVICE AND MANUFACTURING METHOD OF SEMICONDUCTOR DEVICE

(71) Applicant: Kabushiki Kaisha Toshiba, Minato-ku (JP)

(72) Inventor: Kimitoshi Okano, Yokkaichi (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/844,278

(22) Filed: Sep. 3, 2015

(65) Prior Publication Data

US 2016/0268371 A1    Sep. 15, 2016

Related U.S. Application Data

(60) Provisional application No. 62/131,108, filed on Mar. 10, 2015.

(51) Int. Cl.
*H01L 21/76*    (2006.01)
*H01L 29/06*    (2006.01)
*H01L 29/167*    (2006.01)
*H01L 29/78*    (2006.01)
*H01L 29/66*    (2006.01)
(Continued)

(52) U.S. Cl.
CPC ....... *H01L 29/0638* (2013.01); *H01L 21/0257* (2013.01); *H01L 21/02532* (2013.01); *H01L 21/02667* (2013.01); *H01L 21/02694* (2013.01); *H01L 27/11286* (2013.01); *H01L 29/0653* (2013.01); *H01L 29/167* (2013.01); *H01L 29/66537* (2013.01); *H01L 29/78* (2013.01)

(58) Field of Classification Search
CPC .. H01L 29/78; H01L 29/7833; H01L 29/6659; H01L 21/823807; H01L 29/0653
USPC .......................................................... 257/402
See application file for complete search history.

(56) References Cited

U.S. PATENT DOCUMENTS

2006/0214258 A1    9/2006  Kiyotoshi
2009/0242949 A1*  10/2009  Adkisson .......... H01L 27/14603
                                                                    257/292

FOREIGN PATENT DOCUMENTS

JP    2006-269789    10/2006
JP    2010-114131    5/2010
JP    2014-135311    7/2014

OTHER PUBLICATIONS

Yasuhiro Ebihara et al. "Intrinsic Origin of Negative Fixed Charge in Wet Oxidation for Silicon Carbide", Applied Physics Letters, vol. 100, 2012, 4 pages.
(Continued)

*Primary Examiner* — Theresa T Doan
(74) *Attorney, Agent, or Firm* — Oblon, McClelland, Maier & Neustadt, L.L.P.

(57) ABSTRACT

According to one embodiment, a semiconductor device includes a semiconductor substrate made of a first semiconductor material, an element isolation insulating film, a gate electrode film, source/drain regions, a channel region, and a diffusion preventing film. The channel region is provided near a surface of the semiconductor substrate below the gate electrode film, and containing a second impurity of a predetermined conductivity type diffused therein. The diffusion preventing film is provided at an interface between the element isolation insulating film and the semiconductor substrate, and made of a second semiconductor material different from the first semiconductor material.

18 Claims, 20 Drawing Sheets

(51) Int. Cl.
   *H01L 21/02*      (2006.01)
   *H01L 27/112*     (2006.01)

(56) References Cited

OTHER PUBLICATIONS

T. Ernst et al. "A New Si:C Epitaxial Channel nMOSFET Architecture with Improved Drivability and Short-Channel Characteristics", 2003 Symposium on VLSI Technology Digest of Technical Papers, 2003, 2 pages.

* cited by examiner

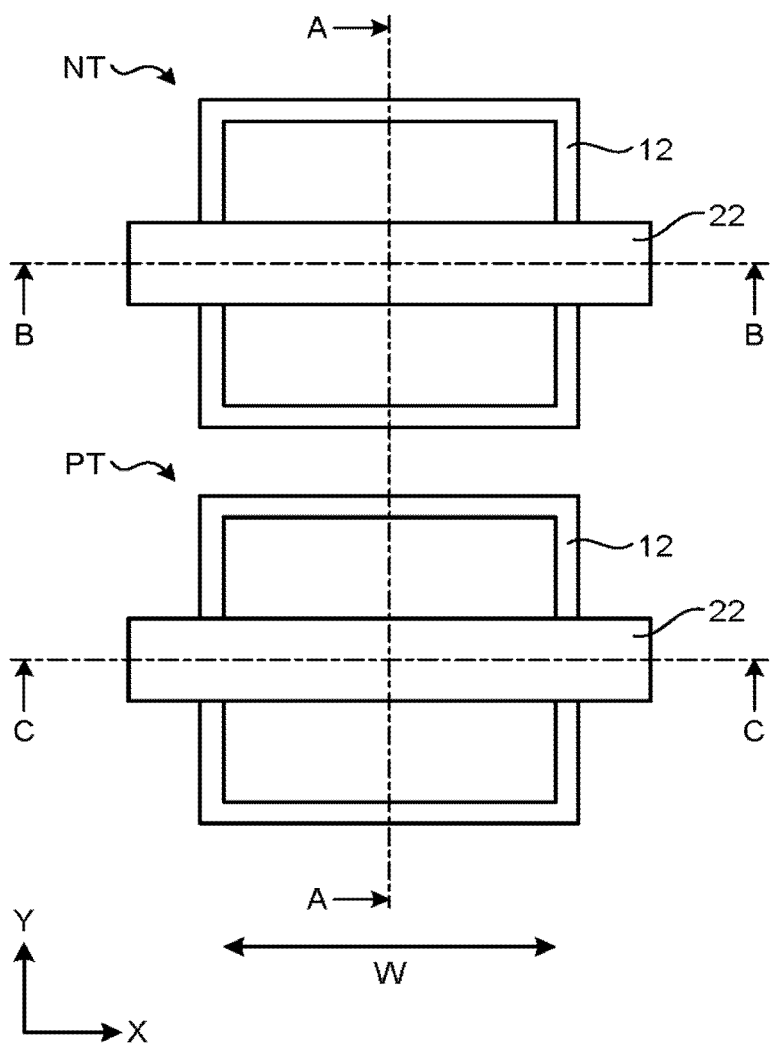

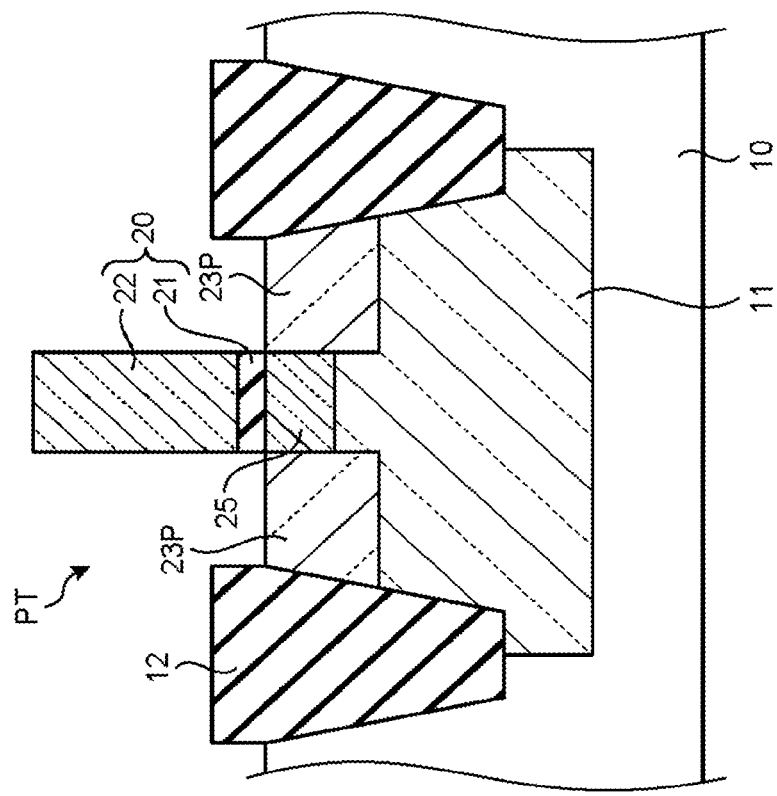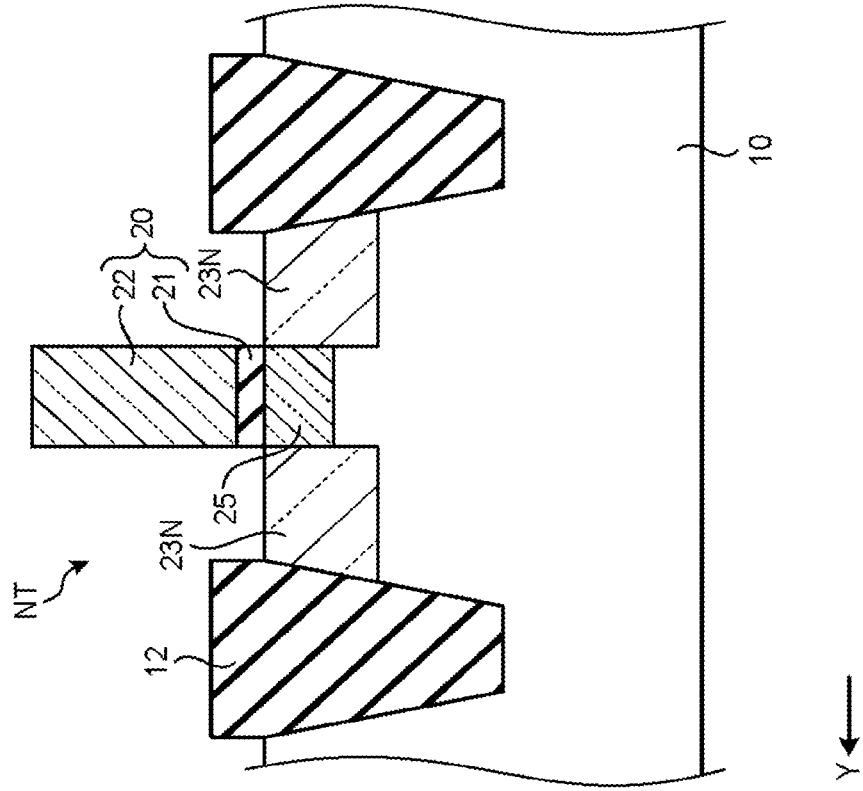

NMOS

PMOS

FIG.5
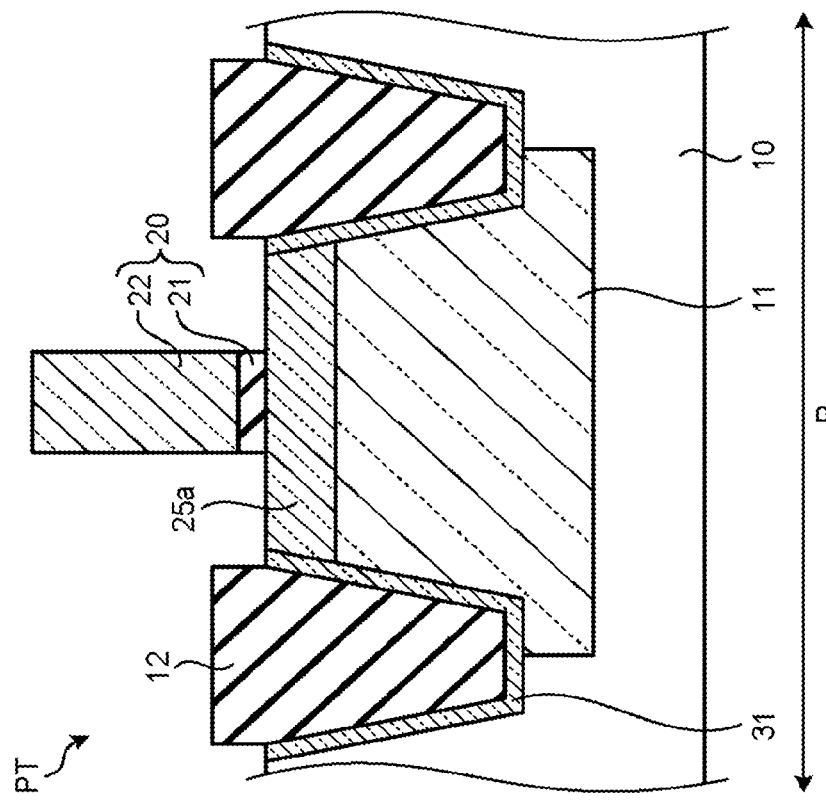
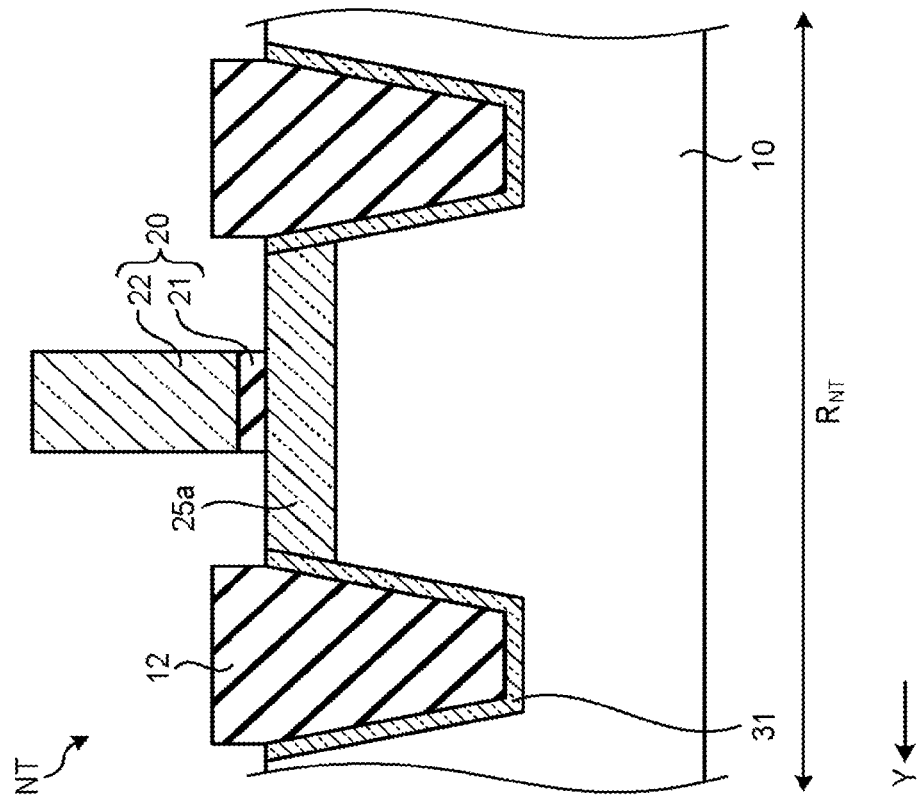

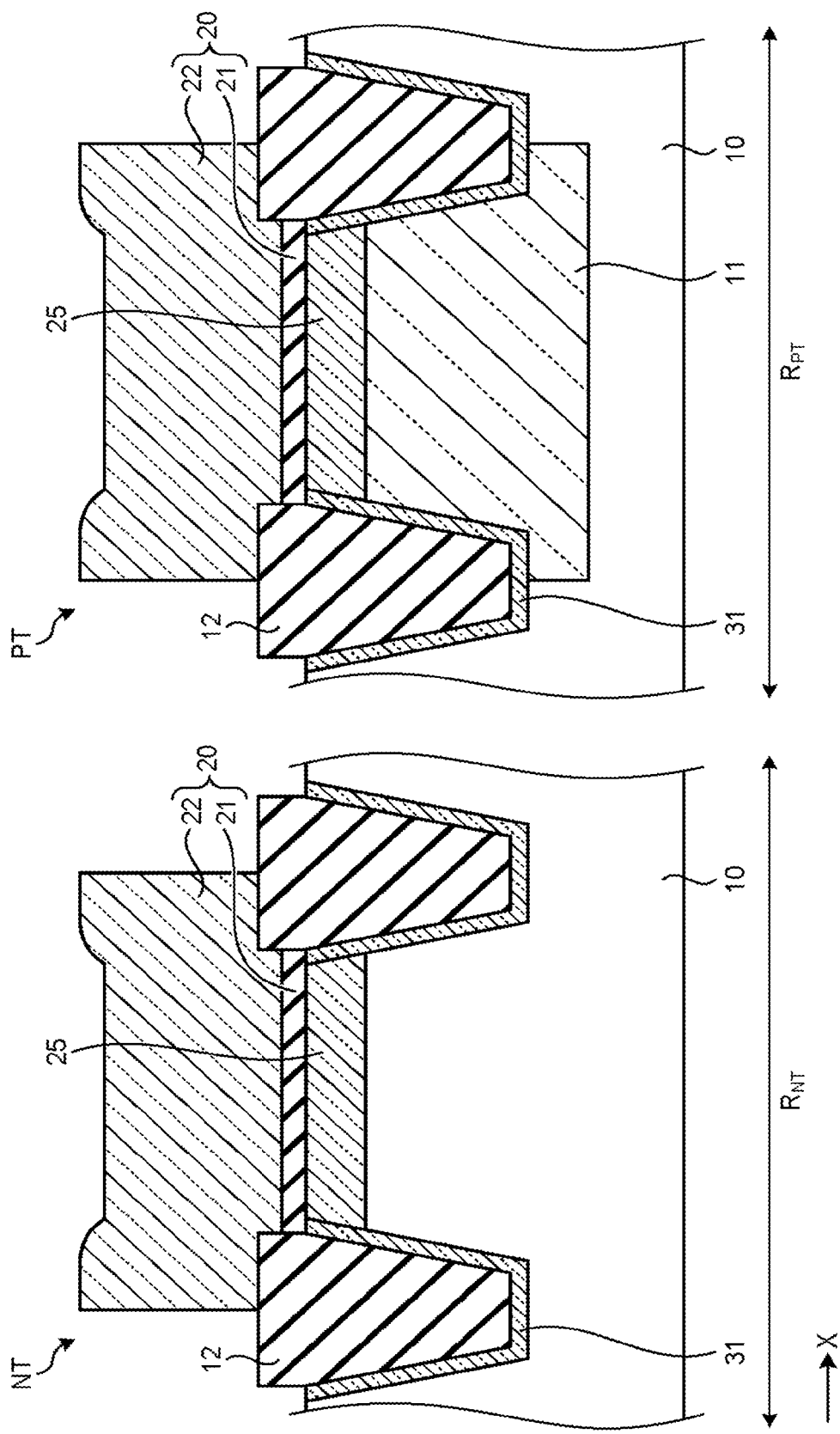

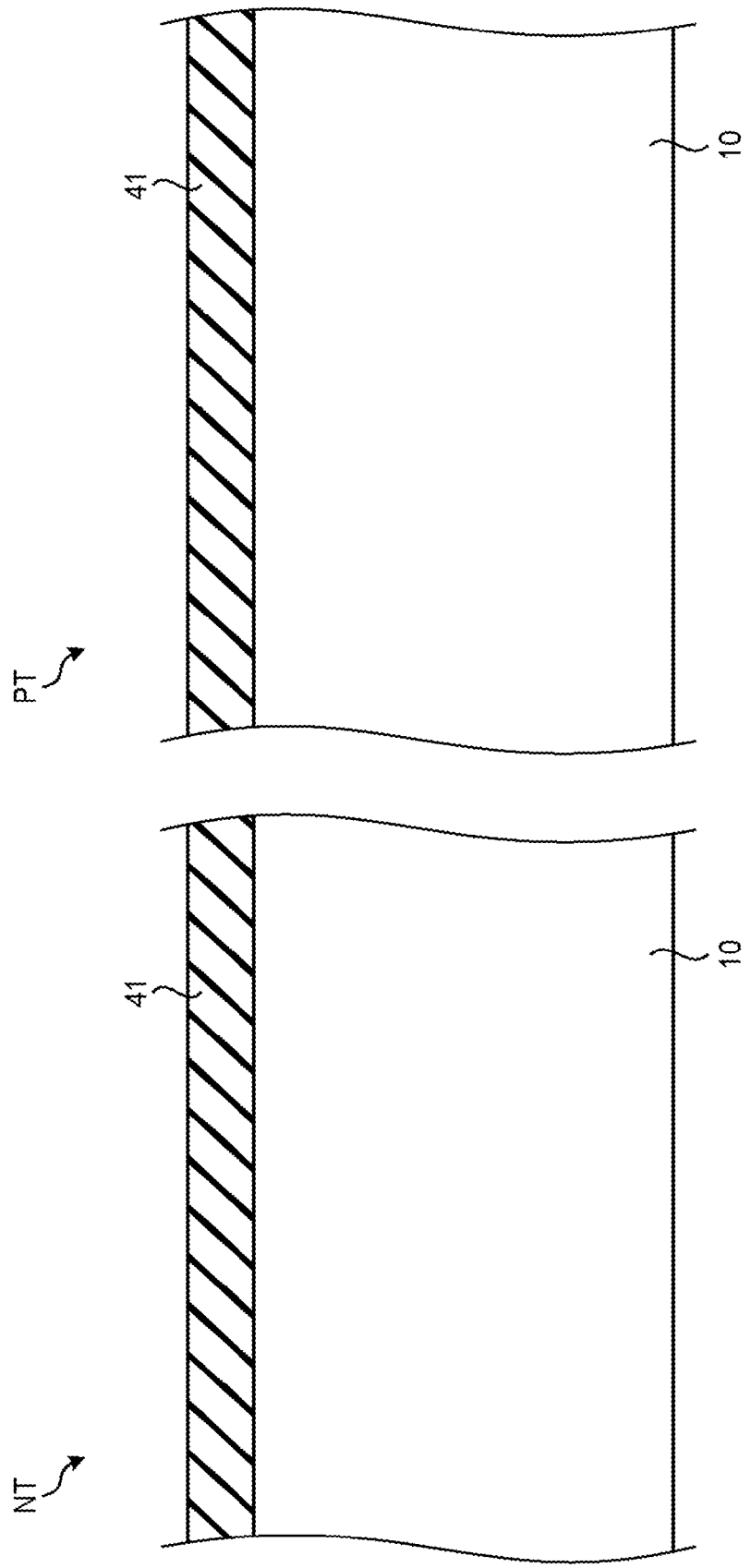

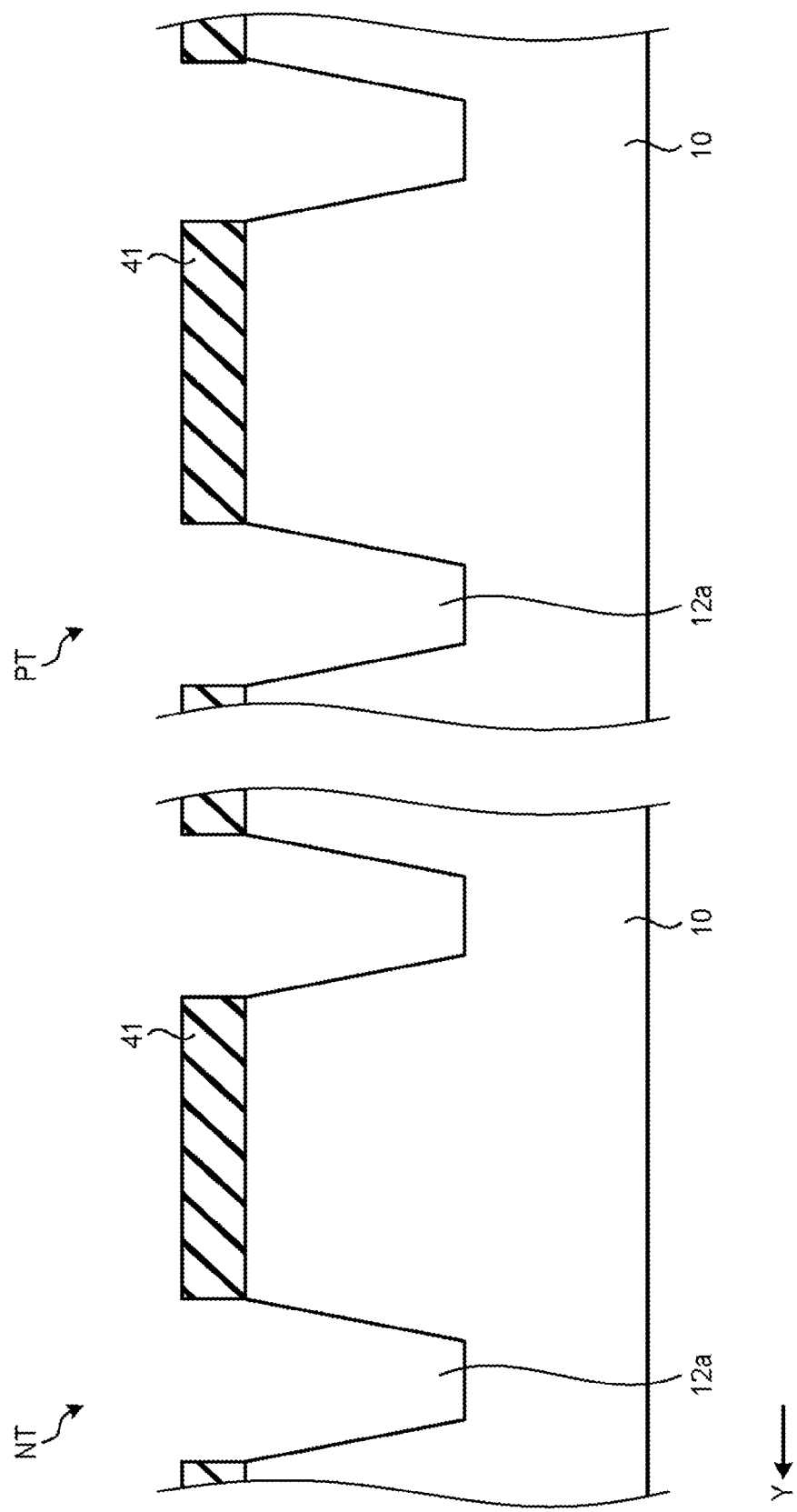

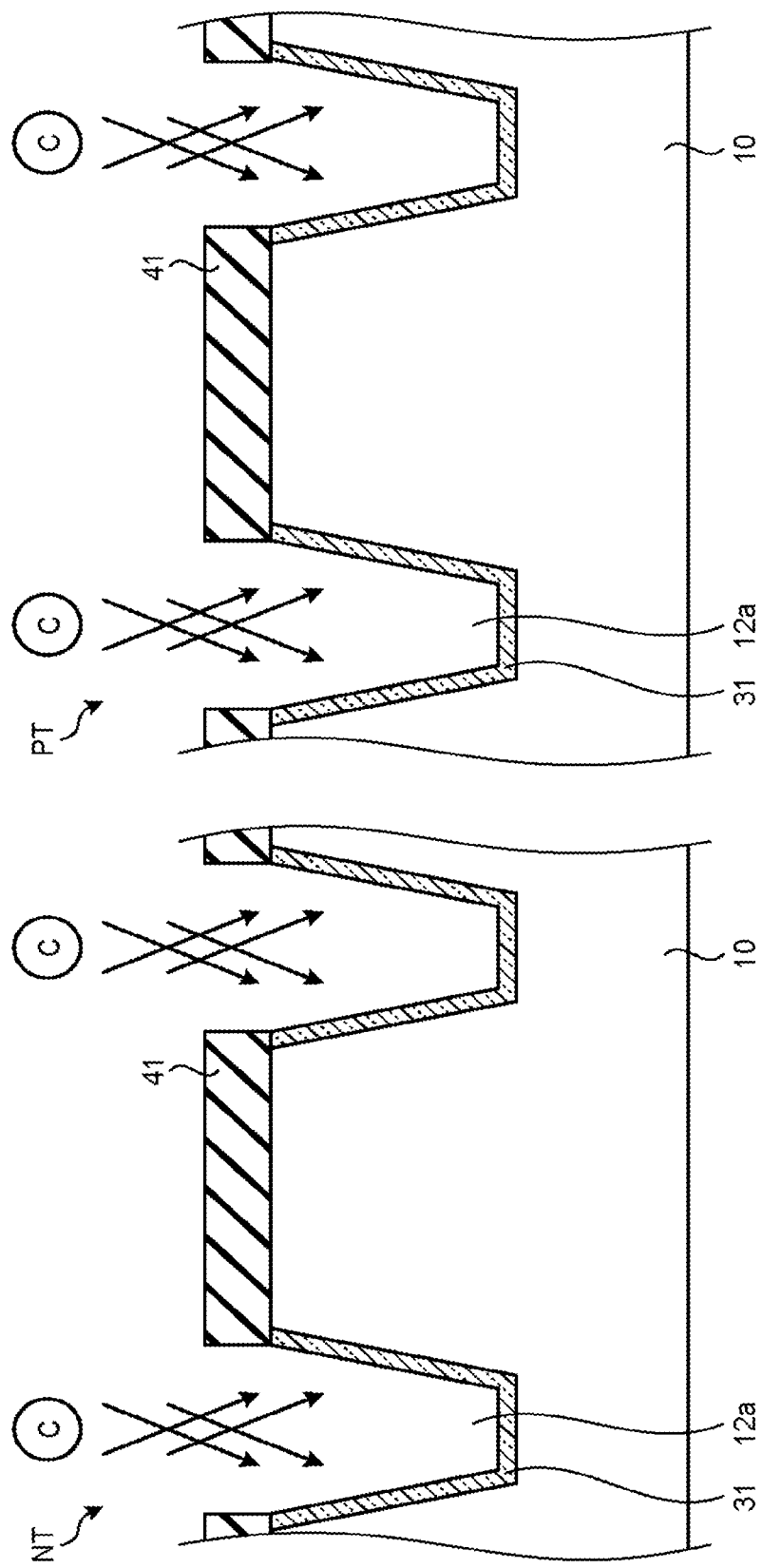

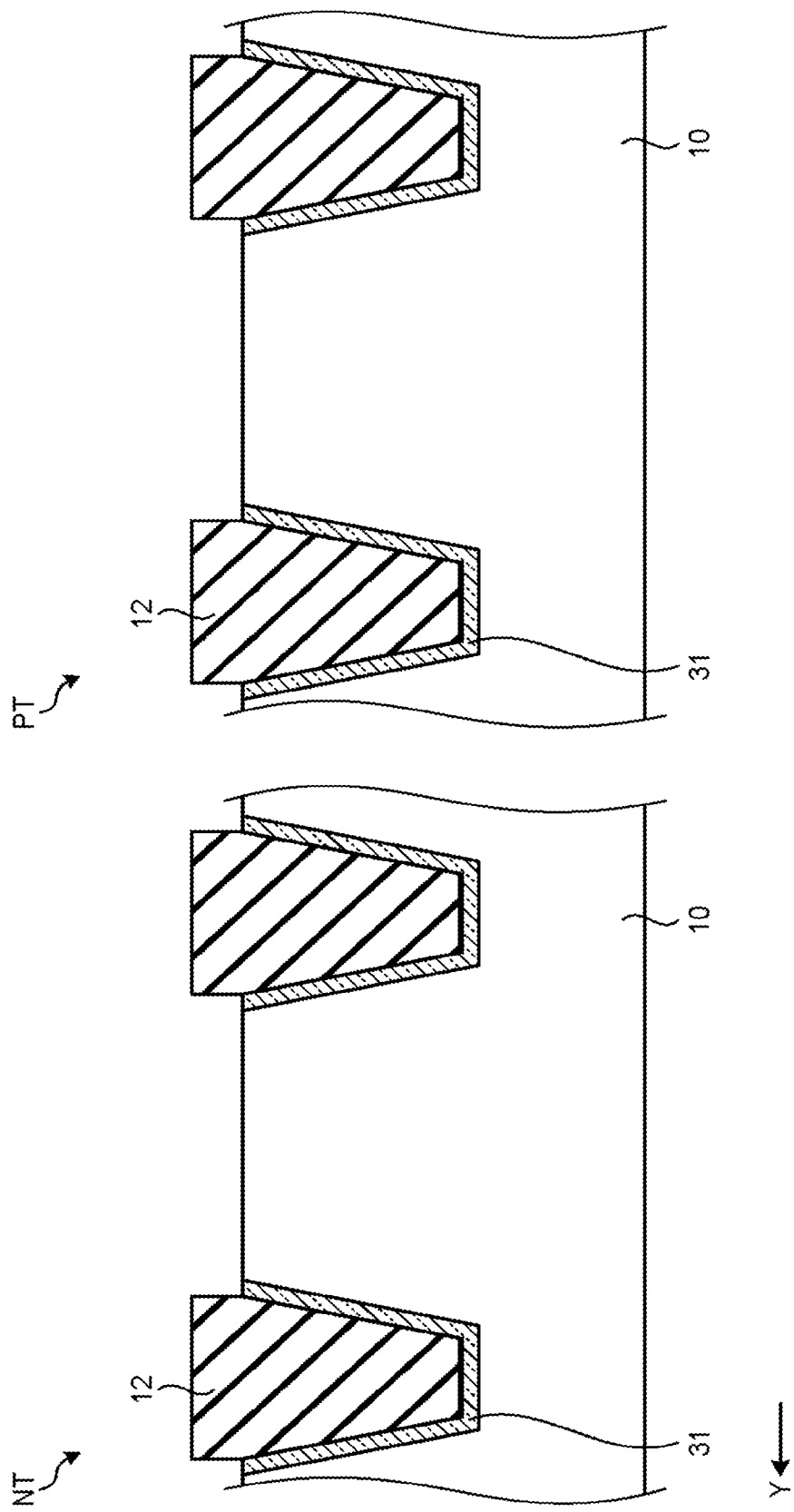

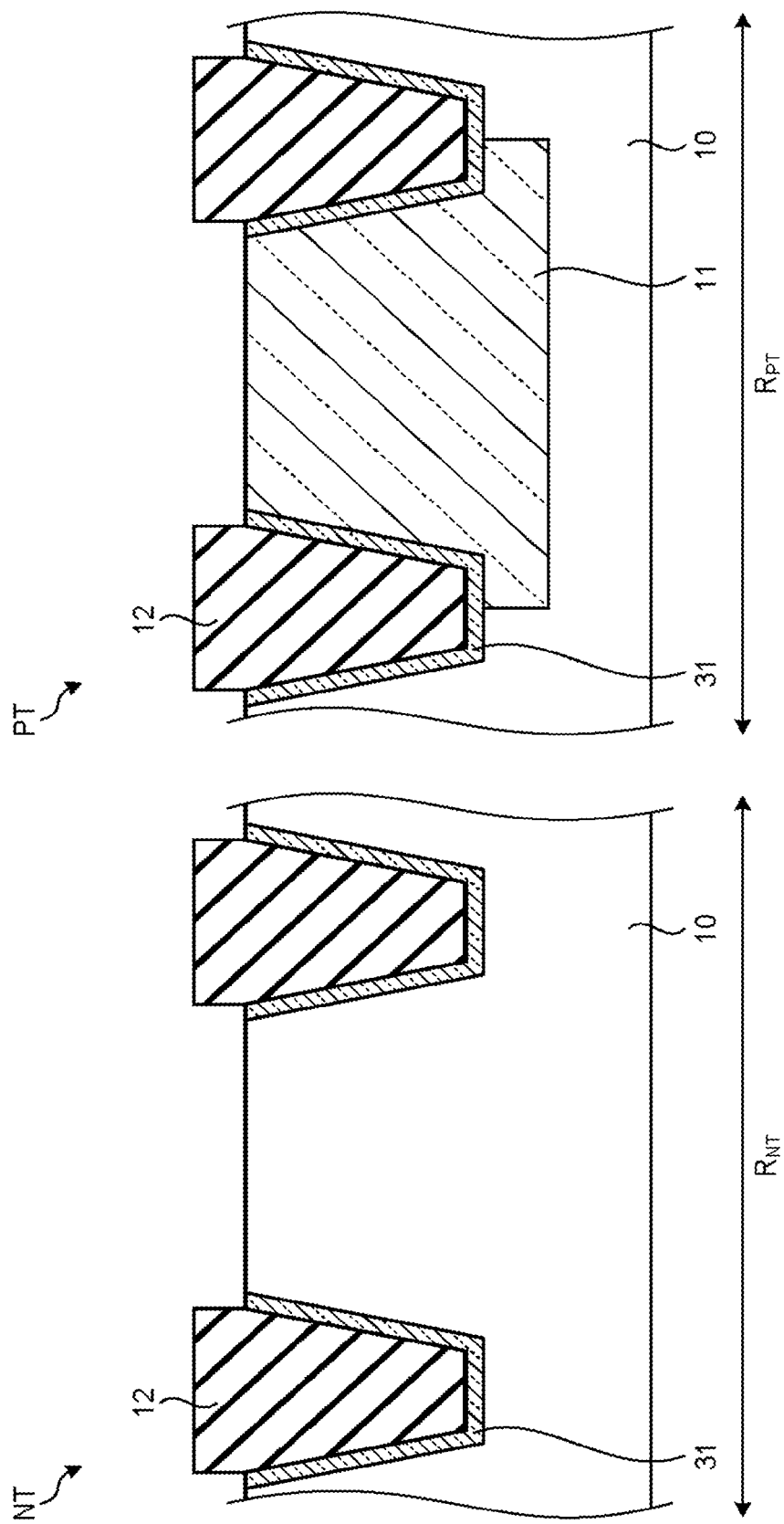

FIG.7F
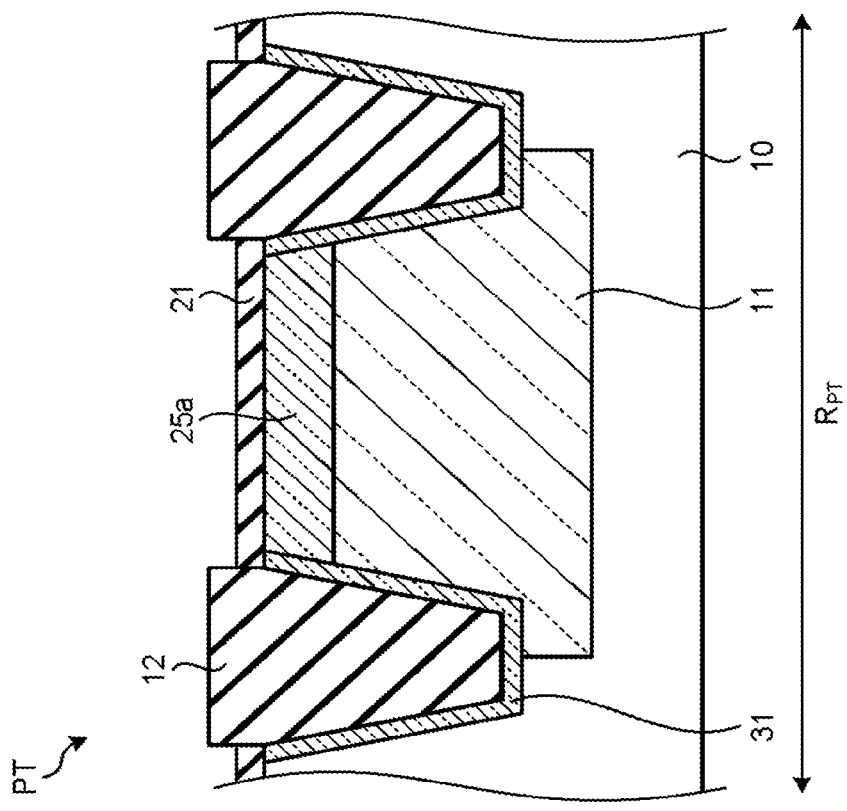
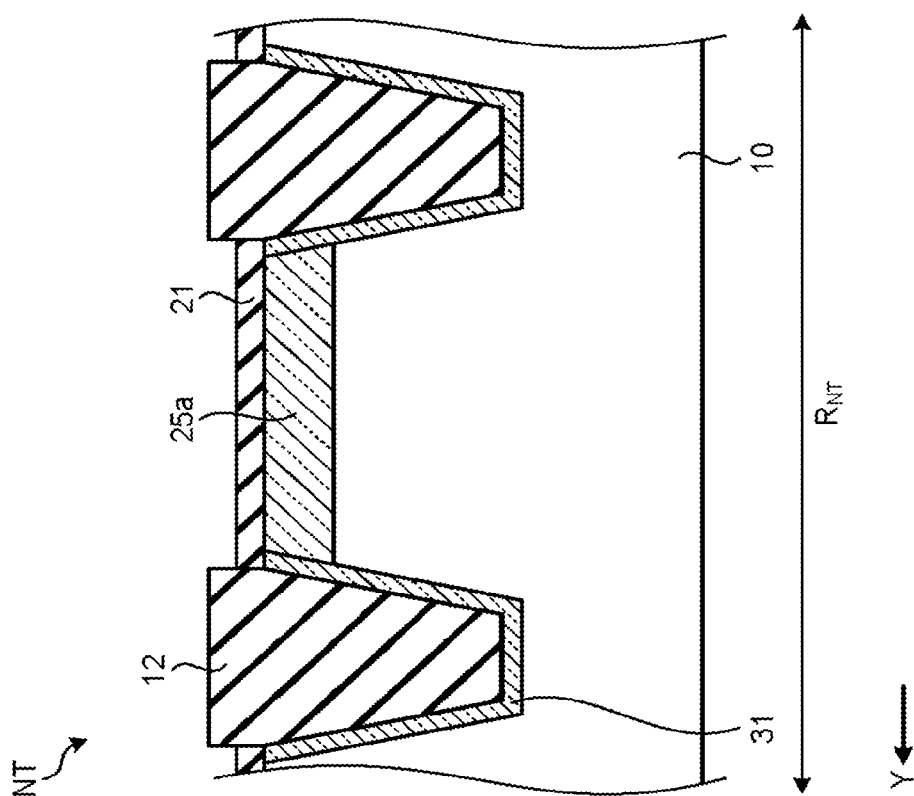

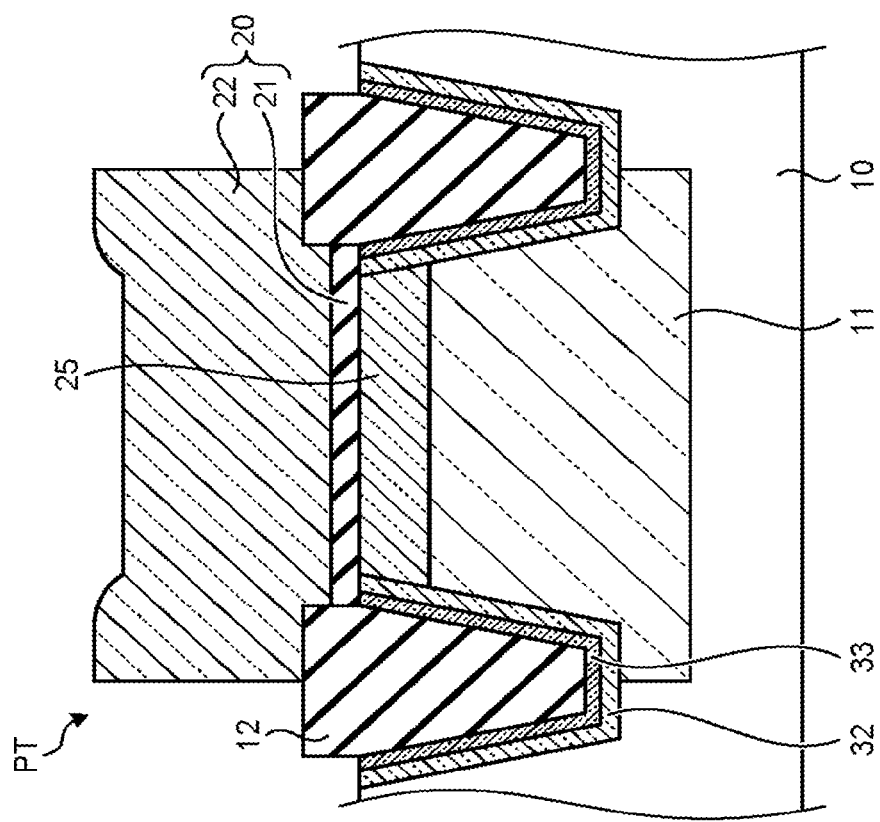
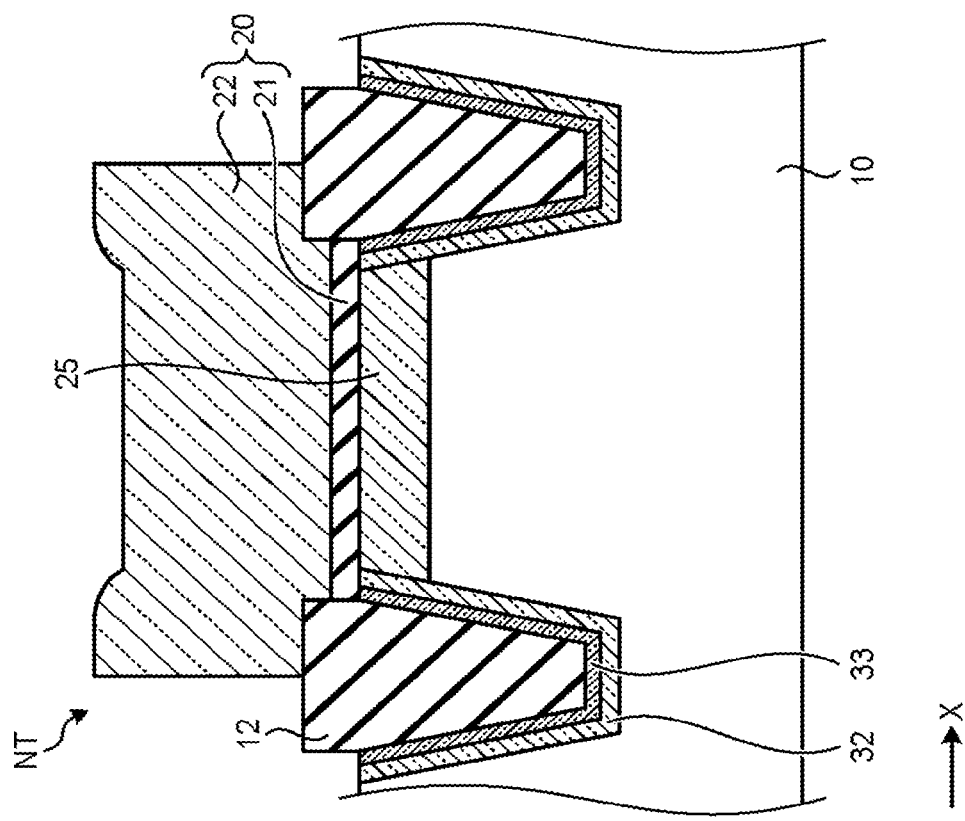
FIG.8

SEMICONDUCTOR DEVICE AND MANUFACTURING METHOD OF SEMICONDUCTOR DEVICE

CROSS-REFERENCE TO RELATED APPLICATIONS

This application is based upon and claims the benefit of priority from U.S. Provisional Application No. 62/131,108, filed on Mar. 10, 2015; the entire contents of which are incorporated herein by reference.

FIELD

Embodiments described herein relate generally to a semiconductor device and a manufacturing method of a semiconductor device.

BACKGROUND

As elements for peripheral circuit of a nonvolatile semiconductor memory device, an N-type MOS (Metal-Oxide-Semiconductor) transistor (which will be referred to as an NMOS transistor, hereinafter) and a P-type MOS transistor (which will be referred to as a PMOS transistor, hereinafter), each of which employs an N-type poly-silicon film as a gate electrode, are used in some cases. In such cases, the threshold voltage of each of these transistors is adjusted by ion implantation of boron (B) into the channel region.

In the transistors having this structure, it is known that, if the channel width is reduced, the threshold voltage of an NMOS transistor is reduced, and the threshold voltage of a PMOS transistor is increased. Because of this channel width dependence in the threshold voltages, the variation of transistor characteristics increase, particularly when they have a small channel width.

BRIEF DESCRIPTION OF THE DRAWINGS

FIG. 1 is a top view showing an example of a structure of a semiconductor device used as a peripheral circuit;

FIG. 2 is a sectional view showing an example of a structure of the semiconductor device in a cross section in the gate length direction;

FIG. 5 is a sectional view showing an example of a structure of a semiconductor device according to a first embodiment in a cross section in the gate length direction;

FIG. 6 is a sectional view showing an example of a structure of the semiconductor device according to the first embodiment in a cross section in the gate width direction;

FIGS. 7A to 7F are views showing an example of a sequence of a manufacturing method of the semiconductor device according to the first embodiment in a cross section in the gate width direction;

FIG. 8 is a sectional view showing an example of a structure of a semiconductor device according to a second embodiment in a cross section in the gate width direction;

DETAILED DESCRIPTION

In general, according to one embodiment, a semiconductor device includes a semiconductor substrate made of a first semiconductor material, an element isolation insulating film, a gate electrode film, source/drain regions, a channel region, and a diffusion preventing film. The element isolation insulating film has a predetermined depth and partitions a predetermined element formation region of a main surface on one side of the semiconductor substrate. The gate electrode film is provided through a gate insulating film above the semiconductor substrate within the element formation region and extends in a first direction. The source/drain regions are provided near a surface of the semiconductor substrate respectively on both sides of the gate electrode film in a second direction perpendicular to the first direction, and contain a first impurity of a predetermined conductivity type diffused therein. The channel region is provided near a surface of the semiconductor substrate below the gate electrode film, and contains a second impurity of a predetermined conductivity type diffused therein. The diffusion preventing film is provided at an interface between the element isolation insulating film and the semiconductor substrate, and is made of a second semiconductor material different from the first semiconductor material.

Exemplary embodiments of a semiconductor device and a manufacturing method of a semiconductor device will be explained below in detail with reference to the accompanying drawings. The present invention is not limited to the following embodiments. The sectional views, and the top view of semiconductor devices used in the following embodiments are schematic, and so the relationship between the thickness and width of each layer and/or the thickness ratios between respective layers may be different from actual states. Further, in the following description, an explanation is first given of an increase in characteristic variations due to a change in the channel width of transistors used for a peripheral circuit, and then an explanation is given of exemplary embodiments of a semiconductor device and a manufacturing method of a semiconductor device, which can suppress an increase in characteristic variations due to a change in the channel width.

Figure 3A:
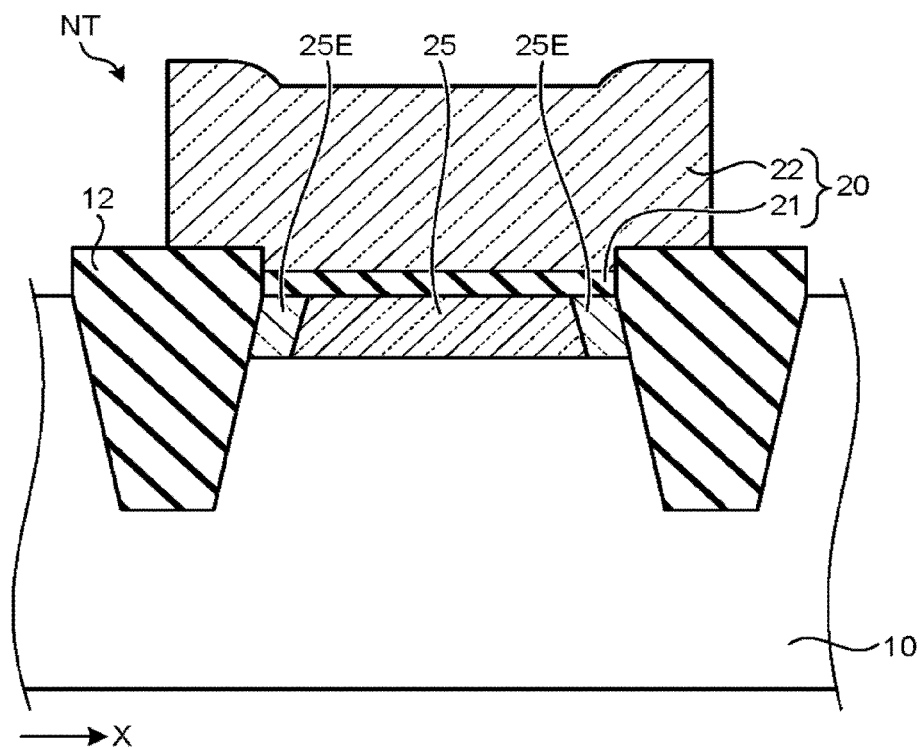
FIGS. 3A and 3B are sectional views showing an example of a structure of the semiconductor device in a cross section in the gate width direction.
Figure 3B:
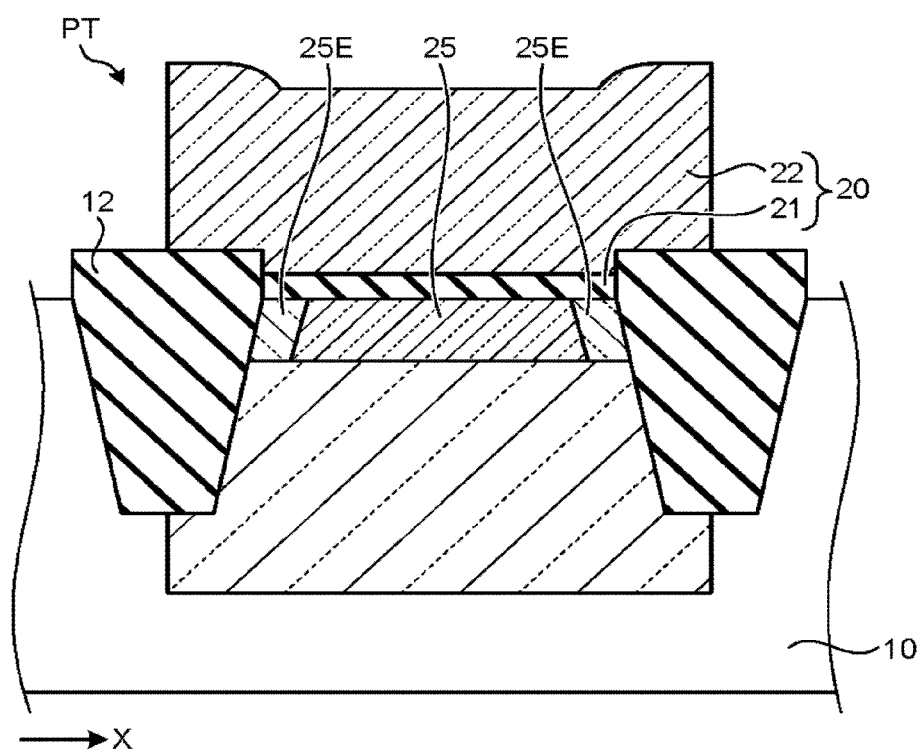

FIG. 1 is a top view showing an example of a structure of a semiconductor device used as a peripheral circuit. FIG. 2 is a sectional view taken along a line A-A in FIG. 1. FIG. 3A is a sectional view taken along a line B-B in FIG. 1, and FIG. 3B is a sectional view taken along a line C-C in FIG. 1. Here, in this specification, a cross section of the semiconductor device taken along the line A-A in FIG. 1 will be referred to as a cross section in the gate length direction, and a cross section of the semiconductor device taken along the line B-B or C-C in FIG. 1 will be referred to as a cross section in the gate width direction. Further, the extending direction of a gate electrode film shown in FIG. 1 will be referred to as an X-direction, and a direction perpendicular the X-direction in FIG. 1 will be referred to as a Y-direction.

On a semiconductor substrate 10, a memory cell part provided with an array of a nonvolatile memory device, such as a NAND type flash memory, is arranged together with a peripheral circuit part arranged around the memory cell part. The semiconductor substrate 10 may be formed of a P-type silicon substrate, for example. The peripheral circuit includes an NMOS transistor NT and a PMOS transistor PT, for example. The NMOS transistor NT is formed on the semiconductor substrate 10, and the PMOS transistor PT is formed on an N-type well 11 that is formed in the semiconductor substrate 10 on the element formation side.

The NMOS transistor NT includes a gate stack 20 and source/drain regions 23N, in which the gate stack 20 is composed of a gate insulating film 21 and a gate electrode film 22 provided in this order at a predetermined position on an active region surrounded by an element isolation insulating film 12. The gate stack 20 is arranged near the center in the Y-direction of the active region surrounded by the element isolation insulating film 12, and extends in the X-direction. The source/drain regions 23N are formed in the semiconductor substrate 10 near its surface at the both sides of the gate stack 20 in the Y-direction. The source/drain regions 23N are respectively formed of N-type diffusion layers containing an N-type impurity, such as phosphorous (P), diffused therein. The active region surrounded by the element isolation insulating film 12 corresponds to an element formation region.

The element isolation insulating film 12 is formed of an insulating film embedded in the semiconductor substrate 10 from the upper surface of the element formation side to a predetermined depth. The element isolation insulating film 12 is made of polysilazane or NSG (Non-doped Silicate Glass), for example. The gate insulating film 21 is formed of a silicon oxide film, and the gate electrode film 22 is formed of an N-type poly-silicon film, for example.

A channel region 25 doped with a P-type impurity, such as boron (B), is formed in the semiconductor substrate 10 between the source region 23N and the drain region 23N. In this way, the NMOS transistor NT employs an N-type poly-silicon film serving as the gate electrode film 22, and the channel region 25 containing B, so that it constitutes a surface channel type transistor. In the surface channel type transistor, a channel is to be formed in the uppermost surface of the semiconductor substrate 10 near the interface between the semiconductor substrate 10 and the gate insulating film 21.

The PMOS transistor PT has a structure similar to the NMOS transistor NT, but differs therefrom in that source/drain regions 23P are formed of P-type diffusion layers containing a P-type impurity, such as B, diffused therein. In this way, the PMOS transistor PT employs an N-type poly-silicon film serving as the gate electrode film 22, and the channel region 25 containing B, so that it constitutes an buried channel type transistor. In the buried channel type transistor, a channel is to be formed in a portion of the semiconductor substrate 10 deeper than its uppermost surface.

Figure 4A:
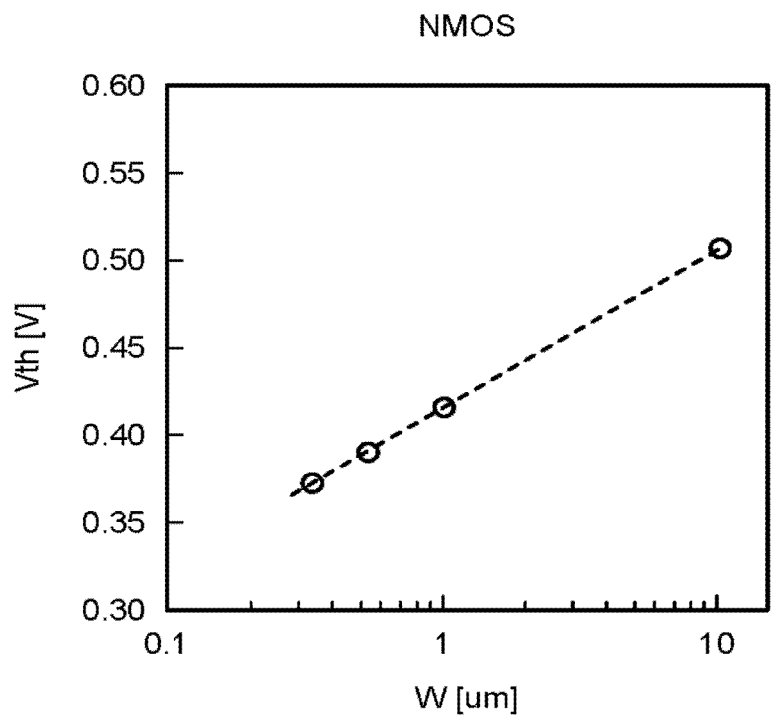
FIGS. 4A and 4B are views respectively showing examples of channel width dependence in the threshold voltages of an NMOS transistor and a PMOS transistor.
Figure 4B:
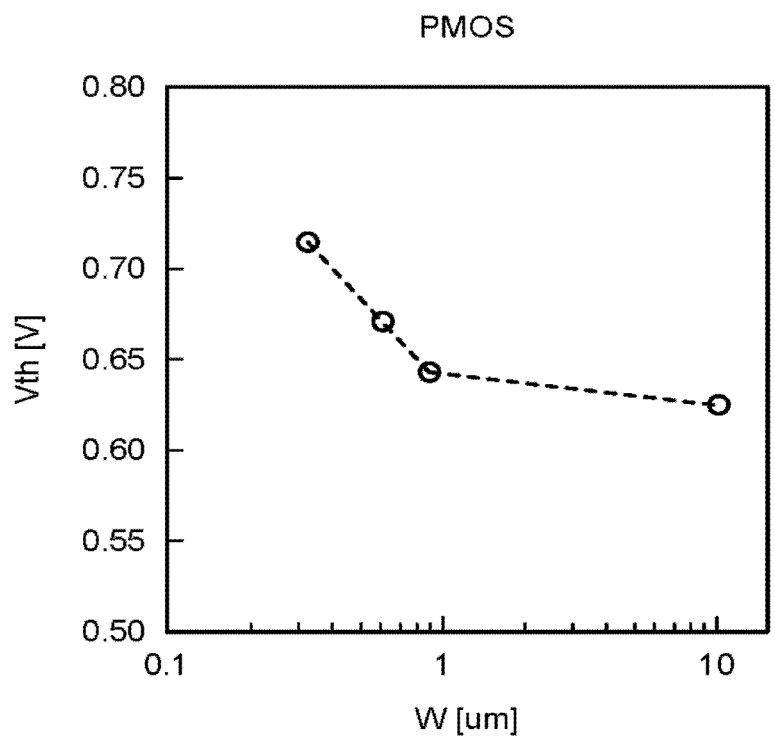

FIGS. 4A and 4B are views respectively showing examples of the dependence of the threshold voltage on the channel width, in the transistors serving as comparative examples. FIG. 4A shows a characteristic of the NMOS transistor, and FIG. 4B shows a characteristic of the PMOS transistor. Here, in FIGS. 4A and 4B, the horizontal axis denotes the dimension of the channel width with a logarithmic scale, and the vertical axis denotes the threshold voltage.

In the NMOS transistor NT, as shown in FIG. 4A, along with a decrease in the channel width W, the threshold voltage also decreases. On the other hand, in the PMOS transistor PT, as shown in FIG. 4B, along with a decrease in the channel width W, the threshold voltage increases. In this way, when the transistors have a smaller channel width W, a change in the channel width W causes the characteristic variations to be more increased, and so it becomes difficult to control the threshold voltage.

As one of the causes of this channel width dependence in the threshold voltage, it is thought that the B concentration is lowered at an end portion 25E of the channel region 25 near the element isolation insulating film 12. This seems to be caused by the fact that B is diffused from the channel region 25 into the element isolation insulating film 12.

Further, as one of the causes of this channel width dependence in the threshold voltage, it is thought that there is a positive fixed charge generated in the element isolation insulating film 12. Particularly, if the element isolation insulating film 12 is made of polysilazane, generation of a positive fixed charge in the element isolation insulating film 12 becomes prominent.

Accordingly, hereinafter, an explanation will be given of embodiments that can suppress fluctuations in the threshold voltages of transistors due to a decrease in the channel width.

First Embodiment

FIG. 5 is a sectional view showing an example of a structure of a semiconductor device according to a first embodiment in a cross section in the gate length direction. FIG. 6 is a sectional view showing an example of a structure of the semiconductor device according to the first embodiment in a cross section in the gate width direction. FIG. 6 illustrates an NMOS transistor NT and a PMOS transistor PT together in a single figure. The constituent elements corresponding to those described with reference to FIGS. 1 to 3B are denoted by the same reference symbols, and their description will be omitted.

In the first embodiment, a layer 31 containing carbon (C) and serving as a diffusion preventing film is provided at the interface between the element isolation insulating film 12 and the semiconductor substrate 10. The carbon-containing layer 31 is formed by ion implantation of C into the semiconductor substrate 10. The carbon-containing layer 31 may be set to have a thickness of about 5 nm to several tens nm, for example. Further, the carbon-containing layer 31 is preferably set to have a C-concentration of $1 \times 10^{13}$ to $1 \times 10^{16}$ [$cm^{-2}$] or more.

The carbon-containing layer 31 provided around the element isolation insulating film 12 prevents B from being diffused from the channel region 25 into the element isolation insulating film 12. As a result, it is possible to suppress a decrease in the B concentration at the end portion 25E of the channel region 25 on the element isolation insulating film 12 side, and thereby to reduce fluctuations in the threshold voltage of each of the NMOS transistor NT and the PMOS transistor PT as the channel width decrease.

Next, an explanation will be given of a manufacturing method of a semiconductor device having the structure described above. FIGS. 7A to 7F are views showing an example of a sequence of a manufacturing method of the semiconductor device according to the first embodiment in a cross section in the gate width direction. Here, each of FIGS. 7A to 7F illustrates the NMOS transistor NT and the PMOS transistor PT side by side in a single figure, for the sake of convenience.

At first, as shown in FIG. 7A, a hard mask film 41 is formed on a semiconductor substrate 10. The semiconductor substrate 10 may be formed of a P-type single-crystalline silicon substrate, for example. Further, the hard mask film 41 may be formed of a silicon nitride film, for example.

Then, a resist (not shown) is applied onto the hard mask film 41, and a pattern having an opening at region for forming the element isolation insulating film 12 is formed by use of a lithography technique and a development technique. Thereafter, the hard mask film 41 is etched, through the resist serving as a mask, by use of anisotropic etching, such as an RIE (Reactive Ion Etching) method. Further, as shown in FIG. 7B, the semiconductor substrate 10 is etched to a predetermined depth, through the hard mask film 41 serving as a mask, by use of anisotropic etching, such as an RIE method, so that a trench 12a for forming the element isolation insulating film 12 is formed.

Then, as shown in FIG. 7C, C is ion-implanted into regions including at least the side surface of the trench 12a, through the hard mask film 41 serving as a mask, by use of an ion implantation method. As described previously, this ion implantation of C is performed within an extent having a thickness of about 5 nm to several tens nm and with a dose amount corresponding to a concentration of $1 \times 10^{13}$ to $1 \times 10^{16}$ [cm$^{-2}$]. Consequently, a carbon-containing layer 31 is formed in the inner surface of each trench 12a of the semiconductor substrate 10.

Thereafter, an element isolation insulating film 12 is embedded in the trench 12a. At this time, the element isolation insulating film 12 is formed to be higher than the upper surface of the hard mask film 41. The element isolation insulating film 12 may be made of polysilazane, for example. Then, part of the film present above the upper surface of the hard mask film 41 is removed, by use of a CMP (Chemical Mechanical Polishing) method or the like, in which the hard mask film 41 serves as a stopper. At this time, part of the hard mask film 41 is also removed. Thereafter, the hard mask film 41 is removed. Consequently, as shown in FIG. 7D, the element isolation insulating films 12 are obtained such that their upper surfaces protrude from the upper surface of the semiconductor substrate 10.

Then, a resist (not shown) is applied onto the entire surface of the semiconductor substrate 10, and is subjected to patterning by use of a lithography technique and a development technique, so that an opening is formed therein at a region $R_{PT}$ for forming the PMOS transistor PT. In other words, a resist pattern is formed to mask a region $R_{NT}$ for forming the NMOS transistor NT. Then, as shown in FIG. 7E, an N-type impurity, such as P, is ion-implanted into the region $R_{PT}$ for forming the PMOS transistor PT, so that an N-type well 11 is formed. Thereafter, the resist is removed.

Then, as shown in FIG. 7F, gate insulating film 21 is formed in the region partitioned by the element isolation insulating film 12 on the semiconductor substrate 10. The gate insulating film 21 is formed by thermally oxidizing the semiconductor substrate 10, for example. Thereafter, a P-type impurity, such as B, is ion-implanted into the semiconductor substrate 10 at a predetermined depth, within the region $R_{NT}$ for forming the NMOS transistor NT and the region $R_{PT}$ for forming the PMOS transistor PT. Consequently, diffusion layers 25a are respectively formed to serve as channel regions 25.

Then, as shown in FIGS. 5 and 6, gate electrode film 22 is formed on the gate insulating film 21. The gate electrode film 22 may be formed of N-type poly-silicon film, for example. Further, a resist (not shown) is applied onto the gate electrode film 22. Then, patterning is performed by use of a lithography technique and a development technique, so that a resist pattern is formed on a stacked film composed of the gate insulating film 21 and the gate electrode film 22. Thereafter, the gate electrode film 22 and the gate insulating film 21 are etched, through the resist pattern serving as a mask, by use of anisotropic etching, such as an RIE method, so that gate stack 20 is formed.

Thereafter, while the region $R_{PT}$ for forming the PMOS transistor PT is masked by a resist pattern (not shown), and the gate stack 20 of the region $R_{NT}$ for forming the NMOS transistor NT is used as a mask, an N-type impurity, such as P, is ion-implanted into the semiconductor substrate 10 within the region $R_{NT}$ for forming the NMOS transistor NT. Consequently, source/drain regions 23N for the NMOS transistor NT are formed. Further, part of the diffusion layer 25a remains only below the gate electrode film 22 such that it serves as a channel region 25.

Further, while the region $R_{NT}$ for forming the NMOS transistor NT is masked by a resist pattern (not shown), and the gate stack 20 of the region $R_{PT}$ for forming the PMOS transistor PT is used as a mask, a P-type impurity, such as B, is ion-implanted into the semiconductor substrate 10 within the region $R_{PT}$ for forming the PMOS transistor PT. Consequently, source/drain regions 23P for the PMOS transistor PT are formed. Further, part of the diffusion layer 25a remains only below the gate electrode film 22 such that it serves as a channel region 25. Consequently, a semiconductor device having the structures shown in FIGS. 2 and 5 is obtained.

According to the first embodiment, each of the NMOS transistor NT and the PMOS transistor PT includes the gate insulating film 21, the gate electrode film 22 formed of an N-type semiconductor film, and the channel region 25 containing B and arranged below them, in which the carbon-containing layer 31 is provided at the interface between the element isolation insulating film 12 and the semiconductor substrate 10. Consequently, B is prevented from being diffused from the channel region 25 into the element isolation insulating film 12, in a cross section in the gate width direction. As a result, there is provided an effect capable of suppressing a decrease in the B concentration at the end portion 25E of the channel region 25 on the element isolation insulating film 12 side, and thereby reducing fluctuations in the threshold voltage of each transistor as the channel width decrease.

Second Embodiment

In the first embodiment, an explanation has been given of a case where it prevents B from being diffused from the channel region 25 into the element isolation insulating film 12, so as to reduce fluctuations in the threshold voltage of each transistor as the channel width decrease. In the second embodiment, in addition to this, an explanation will be given of a semiconductor device and a manufacturing method of a semiconductor device, which can suppress the influence of a positive fixed charge generated in the element isolation insulating film.

FIG. 8 is a sectional view showing an example of a structure of a semiconductor device according to a second embodiment in a cross section in the gate width direction. FIG. 8 illustrates an NMOS transistor NT and a PMOS transistor PT together in a single figure. The constituent elements corresponding to those described with reference to FIGS. 1 to 3B are denoted by the same reference symbols, and their description will be omitted.

In the second embodiment, at the interface between each element isolation insulating film 12 and the semiconductor substrate 10, a carbon-containing silicon film (Si:C film) 32 serving as a diffusion preventing film and a negative fixed charge layer 33 are provided. The carbon-containing silicon film 32 is arranged on the semiconductor substrate 10 side, and the negative fixed charge layer 33 is arranged on the element isolation insulating film 12 side.

The carbon-containing silicon film 32 is formed of a silicon film containing C at 1 at % or more, and preferably at several at % or more. The carbon-containing silicon film 32 may be formed of a single-crystalline film or may be formed of a polycrystalline film. Further, if the semiconductor substrate 10 is formed of a silicon substrate, the carbon-containing silicon film 32 may be a layer formed by ion implantation of C into a region of the substrate in contact with the element isolation insulating film 12. As in the carbon-containing layer 31 described in the first embodiment, the carbon-containing silicon film 32 has a function of preventing B from being diffused from the channel region 25 into the element isolation insulating film 12, so that it can suppress a decrease in the B concentration at the end portion 25E of the channel region 25 on the element isolation insulating film 12 side.

The negative fixed charge layer 33 is formed of a layer containing polyatomic ions including an element for suppressing diffusion of B, with which the carbon-containing silicon film 32 is doped. In this example, the negative fixed charge layer 33 is a layer generated by wet-oxidation of the carbon-containing silicon film 32, and contains carbonate ions $CO_3^{2-}$.

As described previously, a positive fixed charge generated in the element isolation insulating film 12 is one of the causes for the channel width dependence in the threshold voltages of the NMOS transistor NT and the PMOS transistor PT. However, according to the second embodiment, the positive fixed charge in the element isolation insulating film 12 is canceled out by the negative fixed charge layer 33 provided around the element isolation insulating film 12. Consequently, the influence of the positive fixed charge generated in the element isolation insulating film 12 is reduced, as compared with a case without the negative fixed charge layer 33. As a result, it is possible to reduce the channel width dependence in the threshold voltages of the NMOS transistor NT and the PMOS transistor PT. Here, although not shown, the structure in a cross section in the gate length direction is configured such that the carbon-containing layer 31 between each element isolation insulating film 12 and the semiconductor substrate 10 shown in FIG. 5 is replaced with a stacked film of the carbon-containing silicon film 32 and the negative fixed charge layer 33, as shown in FIG. 8.

Next, an explanation will be given of a manufacturing method of a semiconductor device having the structure described above. Hereinafter, there will be described a case where the carbon-containing silicon film 32 is formed of an epitaxial film, a case where it is formed of an amorphous silicon film, and a case where it is formed of a polycrystalline silicon film.

<Where the Carbon-Containing Silicon Film 32 is Formed of an Epitaxial Film>

FIGS. 9A to 9D are views showing an example of a sequence of a manufacturing method of the semiconductor device according to the second embodiment in a cross section in the gate width direction.

Figure 9A:
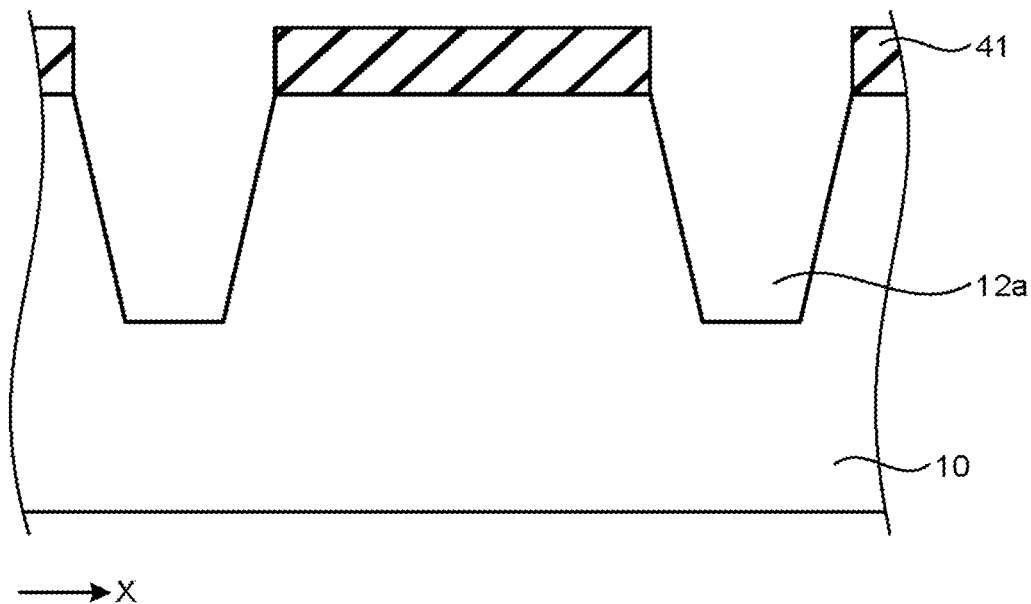
FIGS. 9A to 9D are views showing an example of a sequence of a manufacturing method of the semiconductor device according to the second embodiment in a cross section in the gate width direction.

At first, as shown in FIG. 9A, a hard mask film 41 is formed on a semiconductor substrate 10, and a pattern having opening at region for forming the element isolation insulating film 12 is formed in the hard mask film 41 by use of a lithography technique and an etching technique. Then, the semiconductor substrate 10 is etched to a predetermined depth, through the hard mask film 41 serving as a mask, by use of anisotropic etching, such as an RIE method, so that a trench 12a for forming the element isolation insulating film 12 is formed. Here, the semiconductor substrate 10 is formed of a P-type single-crystalline silicon substrate. Further, the hard mask film 41 may be formed of a silicon nitride film, for example.

Figure 9B:
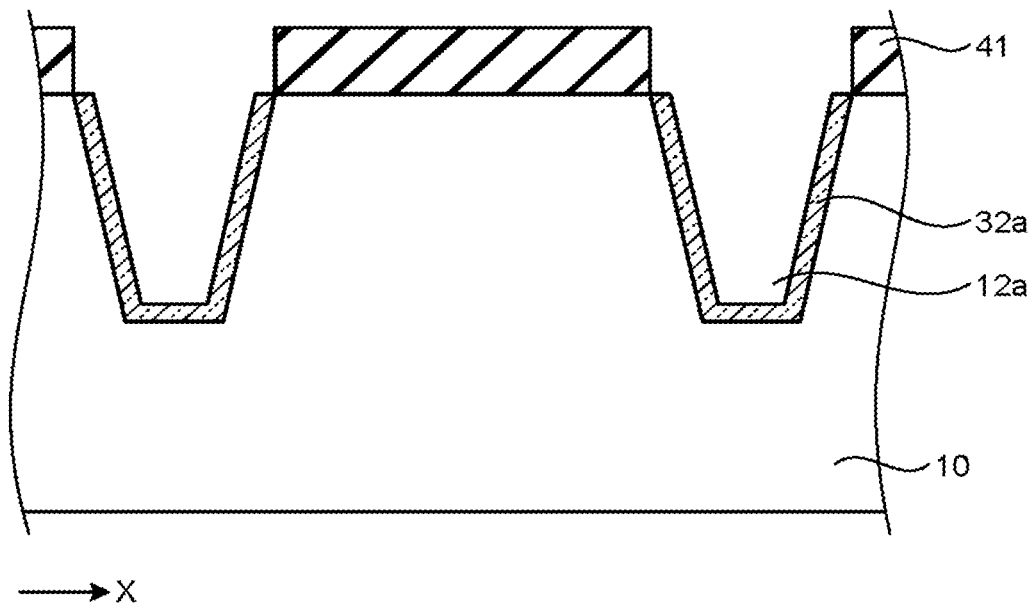

Then, as shown in FIG. 9B, carbon-containing epitaxial silicon film 32a is formed on the inner surface of the trench 12a by use of a selective epitaxial growth method. Each carbon-containing epitaxial silicon film 32a corresponds to the carbon-containing silicon film 32. This film is preferably set to have a C-concentration of 1 at % or more. Further, the carbon-containing epitaxial silicon film 32a may be set to have a thickness of 5 nm or more and 50 nm or less. Here, the carbon-containing epitaxial silicon film 32a is formed only on the inner surface of each trench 12a at which silicon is exposed, and is not formed on the hard mask film 41.

Figure 9C:
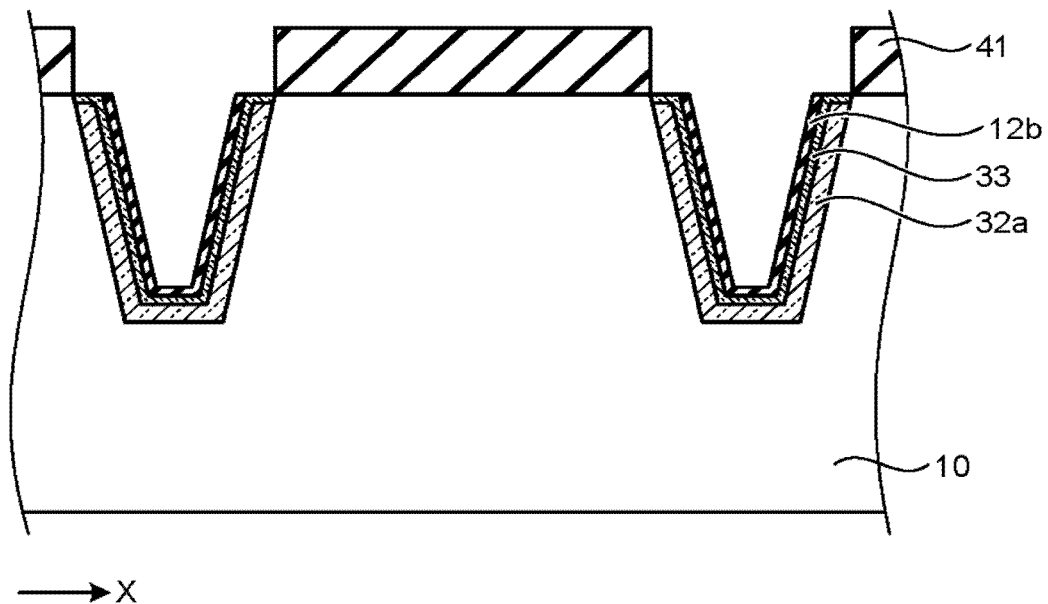

Then, as shown in FIG. 9C, the carbon-containing epitaxial silicon film 32a is oxidized by use of wet oxidation. Consequently, each carbon-containing epitaxial silicon film 32a is oxidized from the surface side to a predetermined depth, so that a negative fixed charge layer 33 and a silicon oxide film ($SiO_2$ film) 12b are formed on each carbon-containing epitaxial silicon film 32a. More specifically, during the wet oxidation, when Si—C in the carbon-containing epitaxial silicon film 32a is oxidized and generates $SiO_2$, unused C is released into the $SiO_2$ side. At this time, Si—O—C bonds are formed. Thereafter, when hydrogen atoms (H) derived from $H_2O$ used for wet oxidation attack the Si—O—C bonds, carbonate ions having a negative charge are generated, and the negative fixed charge layer 33 is thereby formed at the interface between the carbon-containing epitaxial silicon film 32a and the silicon oxide film 12b.

Here, the silicon oxide film 12b is preferably set to have a thickness of several nm to several tens nm. The wet oxidation could be performed to oxidize the entirety of the carbon-containing epitaxial silicon film 32a. However, this would bring about a state where the negative fixed charge layer 33 is present while the carbon-containing epitaxial silicon film 32a has disappeared. In this case, it becomes impossible to obtain an effect of preventing B from being diffused from the channel region 25 into the element isolation insulating film 12. Accordingly, it is preferable that the carbon-containing epitaxial silicon film 32a is oxidized not entirely but is left partly to have a certain thickness.

Figure 9D:
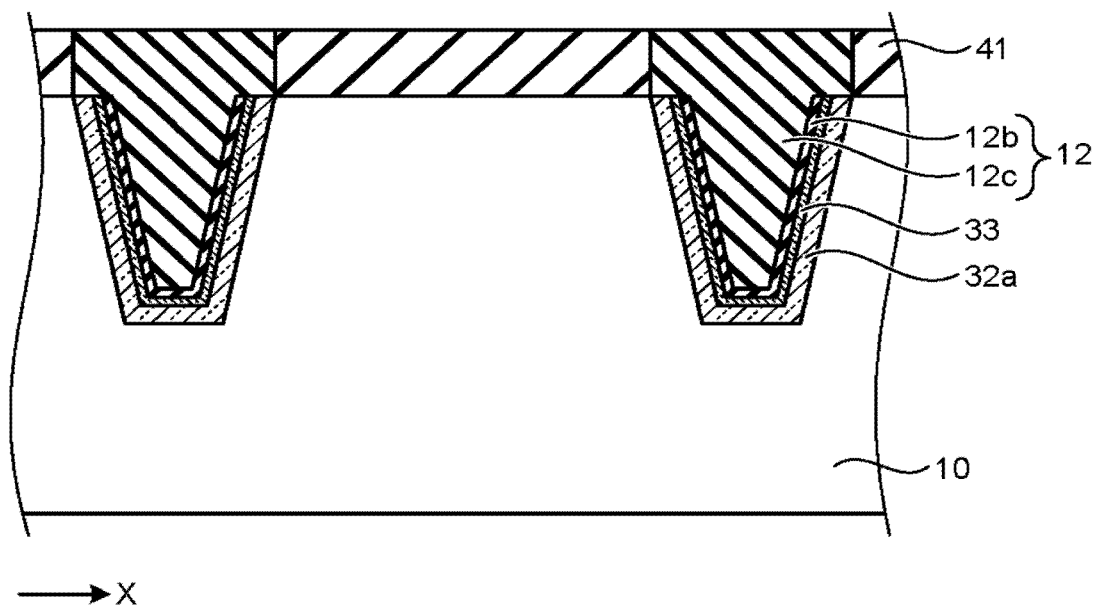

Then, an insulating film 12c is formed over the trench 12a and the hard mask film 41. The insulating film 12c may be made of NSG or the like, for example. Thereafter, the insulating film 12c is planarized, while its part present above the hard mask film 41 is removed, by use of a CMP method, in which the hard mask film 41 serves as a stopper. Consequently, as shown in FIG. 9D, a structure is formed such that an element isolation insulating film 12 composed of the silicon oxide film 12b and the insulating film 12c is embedded in each trench 12a. Thereafter, the processes explained with reference to the figures of from FIG. 7E in the first embodiment are performed, so that the semiconductor device shown in FIG. 8 is obtained.

<Where the Carbon-Containing Silicon Film 32 is Formed of an Amorphous Silicon Film>

FIGS. 10A to 10D are views showing an example of a sequence of a manufacturing method of the semiconductor device according to the second embodiment in a cross section in the gate width direction.

At first, as in FIG. 9A, a hard mask film 41 is formed on a semiconductor substrate 10, and a pattern having an opening at region for forming the element isolation insulating film 12 is formed in the hard mask film 41 by use of a lithography technique and an etching technique. Then, the semiconductor substrate 10 is etched to a predetermined depth, through the hard mask film 41 serving as a mask, by use of anisotropic etching, such as an RIE method, so that the trench 12a for forming the element isolation insulating film 12 is formed. Here, the semiconductor substrate 10 is formed of a P-type single-crystalline silicon substrate. Further, the hard mask film 41 may be formed of a silicon nitride film, for example.

Figure 10A:
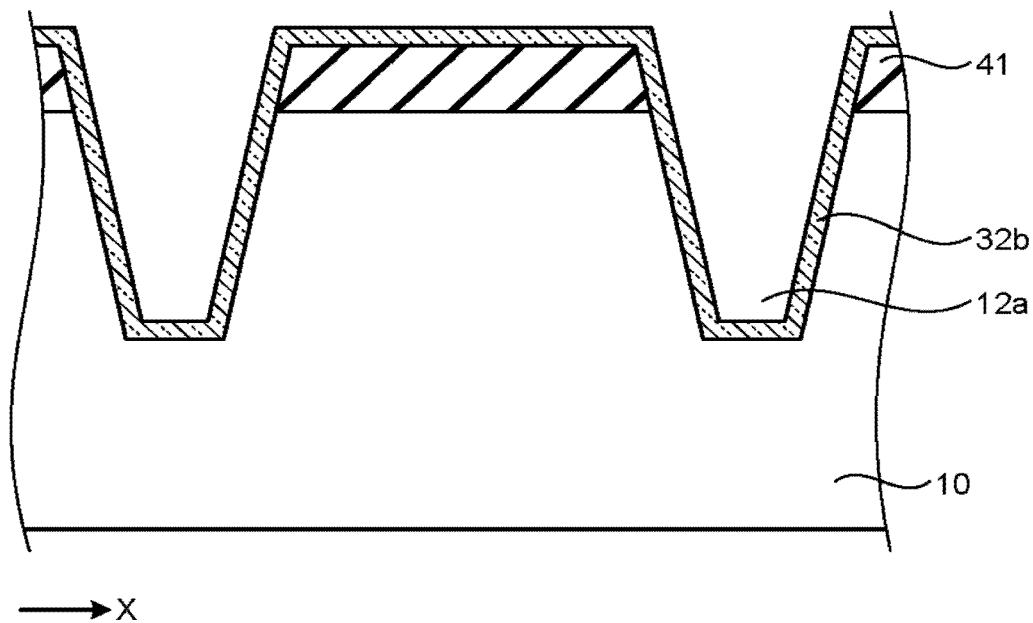
FIGS. 10A to 10D are views showing an example of a sequence of a manufacturing method of the semiconductor device according to the second embodiment in a cross section in the gate width direction.

Then, as shown in FIG. 10A, a C-doped amorphous silicon film 32b is formed on the inner surface of the trench 12a and the upper surface of the hard mask film 41, by use of a film formation method, such as a CVD (Chemical Vapor Deposition) method. This film is preferably set to have a C-concentration of 1 at % or more. Further, the C-doped amorphous silicon film 32b may be set to have a thickness of 5 nm or more and 50 nm or less.

Figure 10B:
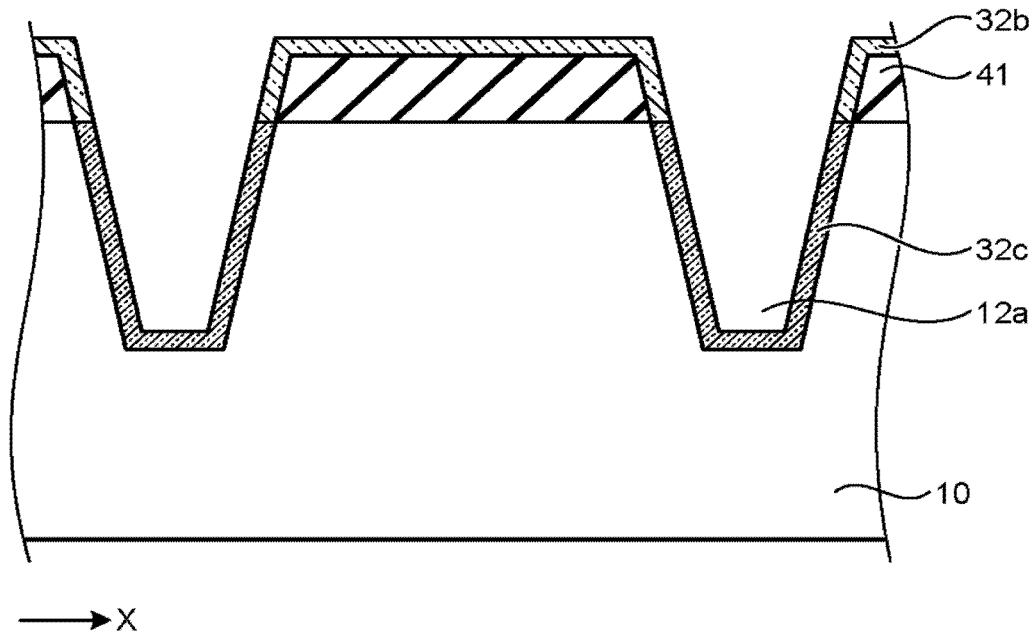

Thereafter, as shown in FIG. 10B, a thermal process is performed so that the C-doped amorphous silicon film 32b is crystallized. For example, the thermal process is performed in an atmosphere of an inactive gas, such as Ar gas or $N_2$ gas, at a temperature of, e.g., 600° C. Since the portion of the C-doped amorphous silicon film 32b formed in the trench 12a is present on the underling single-crystalline silicon, it is crystallized in accordance with the underling layer and is transformed into C-doped crystalline silicon film 32c. C-doped crystalline silicon film 32c corresponds to the carbon-containing silicon film 32. On the other hand, the part of C-doped amorphous silicon film 32b formed on the hard mask film 41 is not crystallized.

Figure 10C:
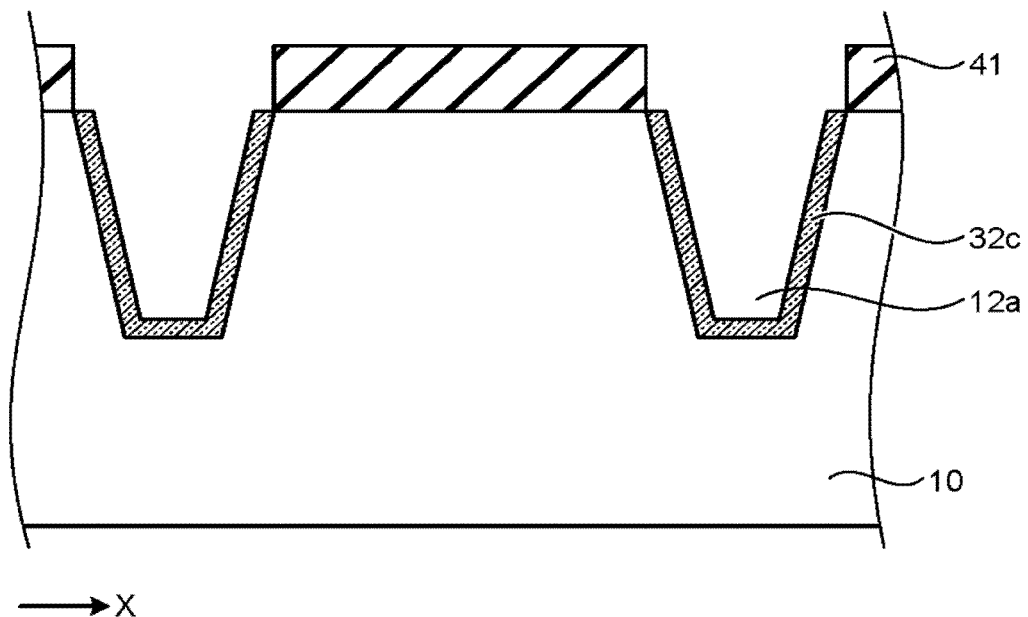

Then, as shown in FIG. 10C, the C-doped amorphous silicon film 32b is selectively removed by etching. For example, in the case of etching using HCl vapor at a temperature of 650° C. or less, it is possible to remove only an amorphous silicon film, while leaving a crystalline silicon film. Consequently, the C-doped crystalline silicon film 32c remains only on the inner surface of each trench 12a.

Figure 10D:
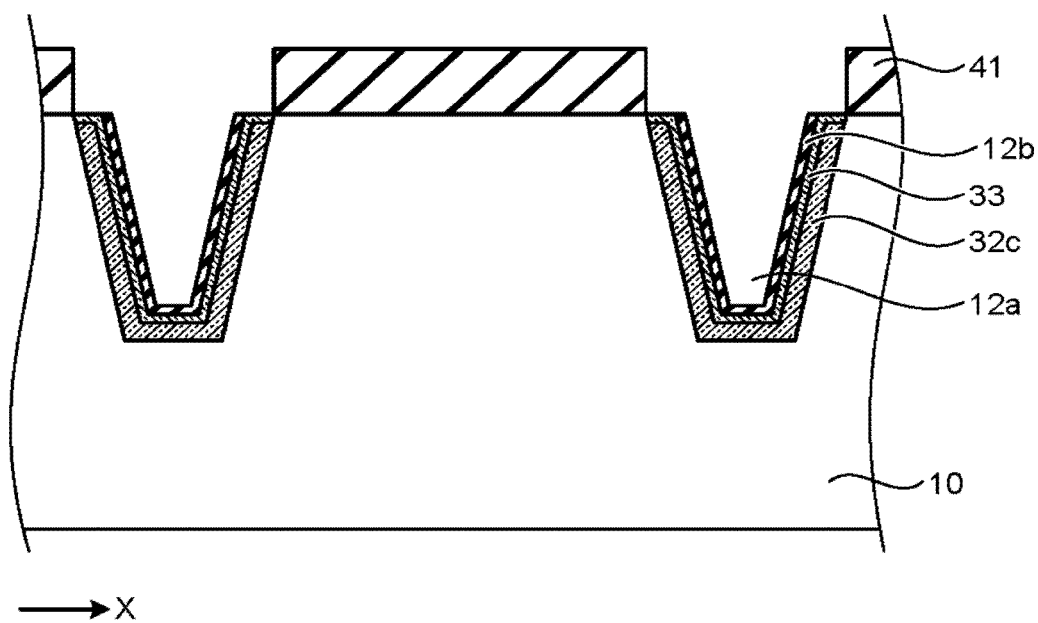

Thereafter, as shown in FIG. 10D, the C-doped crystalline silicon film 32c is oxidized by use of wet oxidation. Consequently, each C-doped crystalline silicon film 32c is oxidized from the surface side to a predetermined depth, so that a negative fixed charge layer 33 and a silicon oxide film ($SiO_2$ film) 12b are formed on each C-doped crystalline silicon film 32c. These films are formed through a process the same as that explained with reference to FIG. 9C. Thereafter, the processes explained with reference to FIG. 9D and the figures of from FIG. 7E are performed, so that the semiconductor device shown in FIG. 8 is obtained.

<Where the Carbon-Containing Silicon Film 32 is Formed of a Polycrystalline Silicon Film>

Figure 11A:
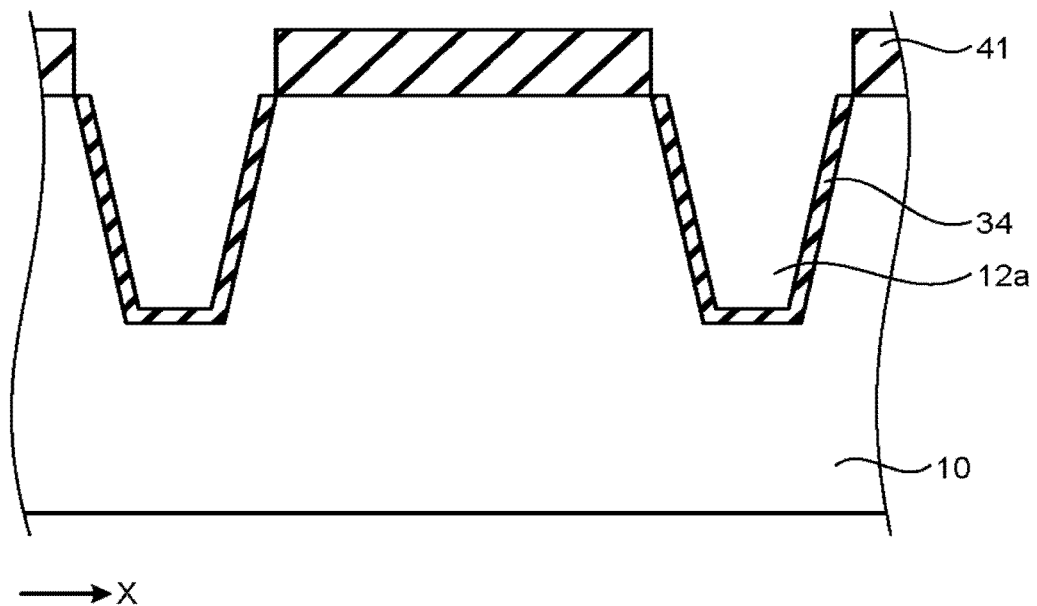
FIGS. 11A to 11C are views showing an example of a sequence of a manufacturing method of the semiconductor device according to the second embodiment in a cross section in the gate width direction.
Figure 11B:
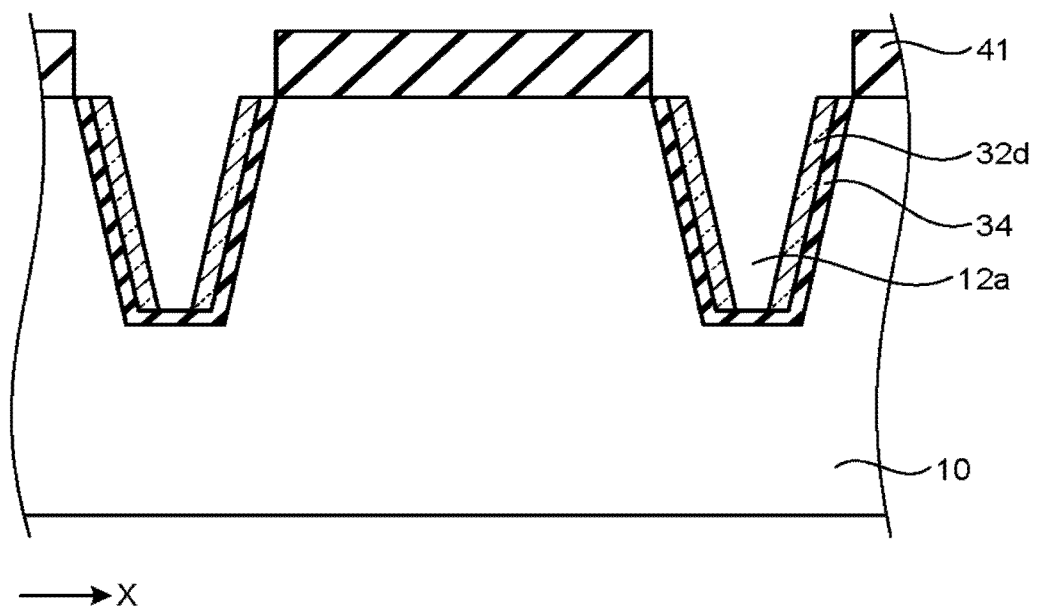
Figure 11C:
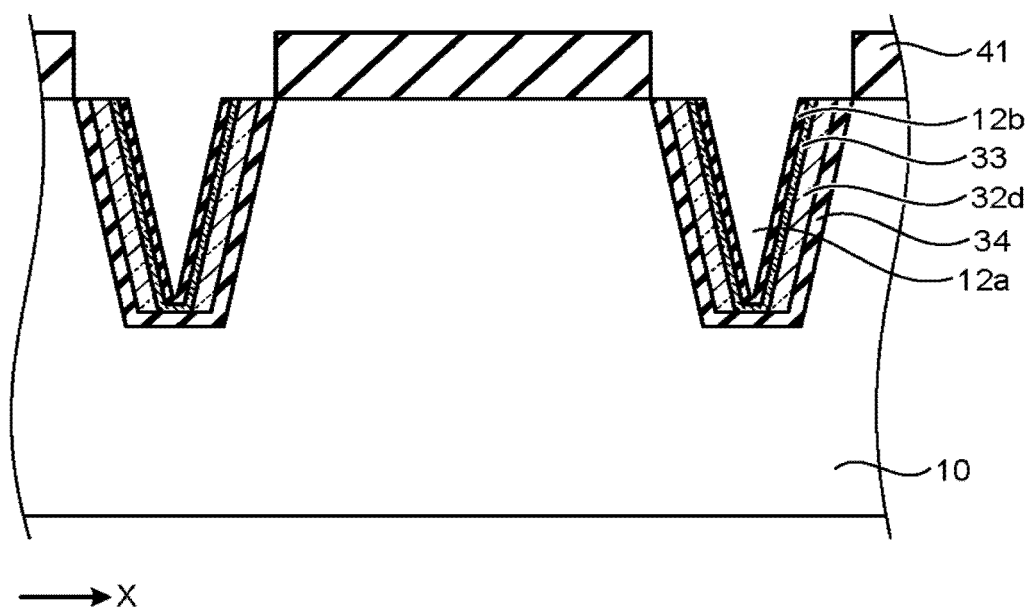

FIGS. 11A to 11C are views showing an example of a sequence of a manufacturing method of the semiconductor device according to the second embodiment in a cross section in the gate width direction.

At first, as in FIG. 9A, a hard mask film 41 is formed on a semiconductor substrate 10, and a pattern having an opening at region for forming the element isolation insulating film 12 is formed in the hard mask film 41 by use of a lithography technique and an etching technique. Then, the semiconductor substrate 10 is etched to a predetermined depth, through the hard mask film 41 serving as a mask, by use of anisotropic etching, such as an RIE method, so that trench 12a for forming the element isolation insulating film 12 is formed. Here, the semiconductor substrate 10 is formed of a P-type single-crystalline silicon substrate. Further, the hard mask film 41 may be formed of a silicon nitride film, for example.

Then, as shown in FIG. 11A, silicon oxide film 34 is formed on the inner surface of the trench 12a by use of thermal oxidation. Each silicon oxide film 34 may be set to have a thickness of about several nm to 20 nm. The silicon oxide film 34 is a film to prevent the grain boundary of a C-doped polycrystalline silicon film, which is to be formed later, from being exposed to the surface of the semiconductor substrate 10 (silicon substrate).

Thereafter, as shown in FIG. 11B, a C-doped polycrystalline silicon film 32d is formed on the inner surface of the trench 12a including the silicon oxide film 34 and on the hard mask film 41, by use of a film formation method, such as a CVD method. This film is preferably set to have a C-concentration of 1 at % or more. Further, the C-doped polycrystalline silicon film 32d may be set to have a thickness of 5 nm or more and 50 nm or less. The C-doped polycrystalline silicon film 32d corresponds to the carbon-containing silicon film 32.

Then, the C-doped polycrystalline silicon film 32d is etched back by use of anisotropic etching, such as an RIE method. Consequently, the portions of the C-doped polycrystalline silicon film 32d formed on the hard mask film 41 and on the bottom of the trench 12a are removed.

Thereafter, as shown in FIG. 11C, C-doped polycrystalline silicon film 32d is oxidized by use of wet oxidation. Consequently, each C-doped polycrystalline silicon film 32d is oxidized from the surface side to a predetermined depth, so that a negative fixed charge layer 33 and a silicon oxide film ($SiO_2$ film) 12b are formed on each C-doped polycrystalline silicon film 32d. These films are formed through a process the same as that explained with reference to FIG. 9C. Thereafter, the processes explained with reference to FIG. 9D and the figures of from FIG. 7E are performed, so that the semiconductor device shown in FIG. 8 is obtained.

In this example, the silicon oxide film 34 is formed as shown in FIG. 11A, but the silicon oxide film 34 may be omitted.

Further, the explanation described above takes as an example a case where a positive fixed charge is generated in the element isolation insulating film 12. However, if a negative fixed charge is generated in the element isolation insulating film 12, a positive fixed charge layer is provided.

According to the second embodiment, each of the NMOS transistor NT and the PMOS transistor PT includes the gate insulating film 21, the gate electrode film 22 formed of an N-type semiconductor film, and the channel region 25 containing B and arranged below them, in which the carbon-containing silicon film 32 is provided at the interface between the element isolation insulating film 12 and the semiconductor substrate 10, and the negative fixed charge layer 33 is further provided at the interface between the carbon-containing silicon film 32 and the element isolation insulating film 12. Consequently, B can be prevented from being diffused from the channel region 25 into the element isolation insulating film 12, in a cross section in the gate width direction. Further, a positive fixed charge generated in the element isolation insulating film 12 can be cancelled out by the negative fixed charge layer 33. As a result, there is provided an effect capable of reducing fluctuations in the threshold voltage of each transistor as the channel width decrease due to a positive fixed charge generated in the element isolation insulating film 12.

Third Embodiment

In the second embodiment, the carbon-containing silicon film has a C-concentration of about several %. In the third embodiment, an explanation will be given of a case where the carbon-containing silicon film has a C-concentration higher than that of the second embodiment.

Figure 12:
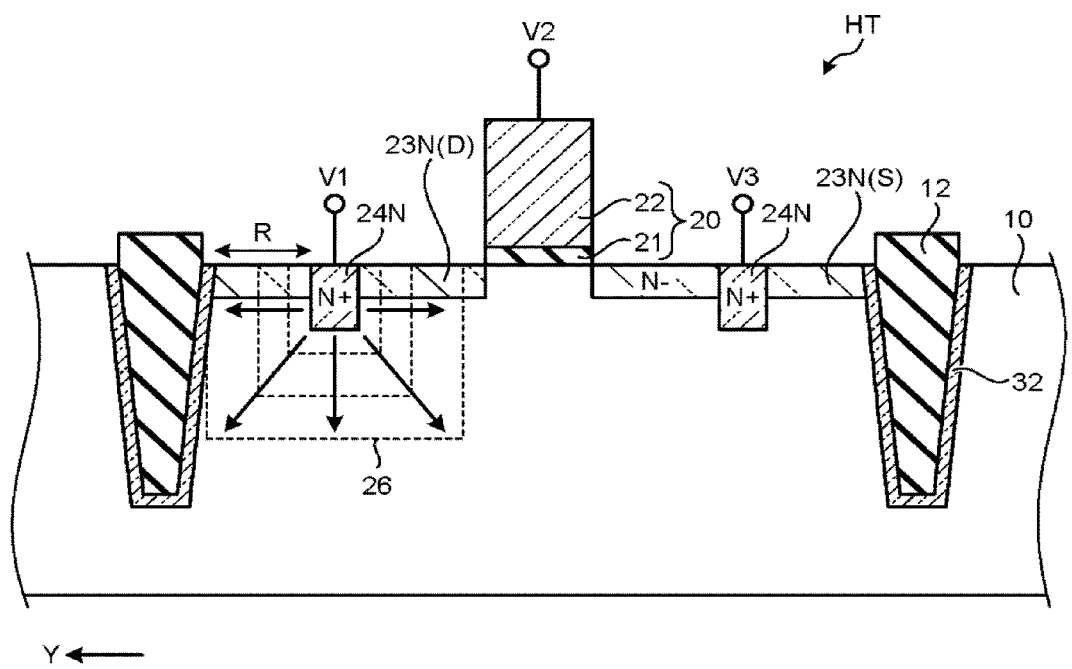
FIG. 12 is a sectional view showing an example of a structure of a semiconductor device according to a third embodiment.

FIG. 12 is a sectional view showing an example of a structure of a semiconductor device according to the third embodiment. FIG. 12 shows a sectional view of a high-voltage transistor HT configured to transfer a voltage for writing or erasing data of memory cells in the NAND type flash memory. Further, in FIG. 12, the channel length direction is set in the Y-direction.

The high-voltage transistor HT includes a gate stack 20, a source region 23N(S), and a drain region 23N(D), in which the gate stack 20 is composed of a gate insulating film 21 and a gate electrode film 22 provided in this order at a predetermined position on an active region surrounded by an element isolation insulating film 12. The gate stack 20 is arranged near the center in the Y-direction of the active region surrounded by the element isolation insulating film 12, and extends in the X-direction perpendicular to the Y-direction. The source region 23N(S) and the drain region 23N(D) are formed in a semiconductor substrate 10 near its surface at the both sides of the gate stack 20 in the Y-direction. The source region 23N(S) and the drain region 23N(D) are respectively formed of N-type diffusion layers containing an N-type impurity, such as phosphorous (P), diffused therein at a low concentration.

An N-type diffusion layer 24N having an N-type impurity concentration higher than the source region 23N(S) and the drain region 23N(D) is provided at a connection region of each of the source region 23N(S) and the drain region 23N(D) connected to a contact. The N-type diffusion layer 24N corresponds to a connection layer.

The element isolation insulating film 12 is formed of an insulating film embedded in the semiconductor substrate 10 from the upper surface of the element formation side to a predetermined depth. Further, a carbon-containing silicon film 32 is provided at the interface between the element isolation insulating film 12 and the semiconductor substrate 10. The carbon-containing silicon film 32 is set to have a C-concentration of several at % or more.

In the high-voltage transistor HT having the structure described above, it is assumed that a voltage V1 is applied to the N-type diffusion layer 24N on the drain region side, a voltage V2 is applied to the gate electrode film 22, and a voltage V3 is applied to the N-type diffusion layer 24N on the source region side.

For example, if the potential of V1 is increased under conditions of V2=V3=0V, a depletion layer 26 around the N-type diffusion layer 24N on the drain region side spreads, and eventually comes into contact with an end of the element isolation insulating film 12. When the depletion layer 26 comes into contact with the end of the element isolation insulating film 12, the junction leakage current due to crystal defects or the like generated in the semiconductor substrate 10 at the end of the element isolation insulating film 12 is increased, and the junction breakdown occurs. The junction breakdown voltage of the high-voltage transistor HT is determined by the distance R between the end of the element isolation insulating film 12 and the N-type diffusion layer 24N, but the R can be hardly reduced and becomes one of the factors that hinder a decrease in the size of a circuit including the high-voltage transistor HT.

In the second embodiment, the carbon-containing silicon film 32 formed around the element isolation insulating film 12 has a C-concentration of several at %. In the case of the carbon-containing silicon film 32 containing C at several at %, the band gap is larger as compared with the ordinary silicon film. Accordingly, even if leakage sources, such as crystal defects, are generated at the end of the element isolation insulating film 12 in an amount almost the same as that of the conventional technique, the junction leakage current can be reduced by the larger band gap of the carbon-containing silicon film 32. As a result, an improvement of the junction breakdown voltage can be expected. Consequently, while the junction breakdown voltage is kept essentially equal, the layout of the high-voltage transistor HT (the distance R between the end of the element isolation insulating film 12 and the N-type diffusion layer 24N) can be set smaller, so that it is possible to reduce the area of a circuit employing the high-voltage transistor HT.

Further, in the example described above, the carbon-containing silicon film 32 has a C-concentration of several at %, but the carbon-containing silicon film 32 may have a C-concentration further increased, so that the junction breakdown voltage can be further raised. Further, if the carbon-containing silicon film 32 is replaced with a SiC film, which is a wide band gap semiconductor, the junction breakdown voltage can be further improved, as compared with a case where the carbon-containing silicon film 32 having a C-concentration of several at % is used. As a result, it is possible to further reduce the area of a circuit employing the high-voltage transistor HT.

According to the third embodiment, each of the source region 23N(S) and the drain region 23N(D) is formed with the N-type diffusion layer 24N, and the carbon-containing silicon film 32 is provided at the interface between the element isolation insulating film 12 and the semiconductor substrate 10. Consequently, when the gate electrode film 22 and the source region 23N(S) are respectively supplied with predetermined voltages, and the drain region 23N(D) is supplied with a voltage larger than the voltages supplied to the gate electrode film 22 and the source region 23N(S), it is possible to reduce the junction leakage current caused when the depletion layer 26 generated around the N-type diffusion layer 24N in the drain region 23N(D) reaches the element isolation insulating film 12.

Further, the junction breakdown voltage is determined by the distance R between the element isolation insulating film 12 and the N-type diffusion layer 24N in the drain region 23N(D). If the junction breakdown voltage is improved by use of a wide band gap material around the element isolation insulating film 12, the distance R can be reduced while the junction breakdown voltage is kept essentially equal. Consequently, there is provided an effect capable of further reducing the area of a circuit employing the high-voltage transistor HT.

The explanation described above takes as an example a case where the gate electrode film 22 is formed of an N-type silicon film and the channel region 25 is doped with B, but this is not limiting. The gate electrode film 22 may be formed of a P-type silicon film doped with a P-type impurity, may be formed of another N-type semiconductor film doped with an N-type impurity, or may be formed of another P-type semiconductor film doped with a P-type impurity. Further, the channel region may be doped with a P-type impurity other than B, or may be doped with an N-type impurity.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
    a semiconductor substrate made of a first semiconductor material;
    an element isolation insulating film having a predetermined depth and partitioning a predetermined element formation region of a main surface on one side of the semiconductor substrate;
    a gate electrode film provided through a gate insulating film above the semiconductor substrate within the element formation region and extending in a first direction;
    source/drain regions provided near a surface of the semiconductor substrate respectively on both sides of the gate electrode film in a second direction perpendicular to the first direction, and containing a first impurity of a predetermined conductivity type diffused therein;
    a channel region provided near a surface of the semiconductor substrate below the gate electrode film, and containing a second impurity of a predetermined conductivity type diffused therein;
    a diffusion preventing film provided at an interface between the element isolation insulating film and the semiconductor substrate, and made of a second semiconductor material different from the first semiconductor material; and
    a fixed charge layer provided at an interface between the diffusion preventing film and the element isolation insulating film, wherein
    the fixed charge layer has a fixed charge of a reverse sign to a fixed charge to be generated in the element isolation insulating film.

2. The semiconductor device according to claim 1, wherein the diffusion preventing film is made of the second semiconductor material obtained by doping the first semiconductor material with an element preventing diffusion of the second impurity.

3. The semiconductor device according to claim 1, wherein the gate electrode film includes a semiconductor material doped with an N-type impurity,
    the second impurity is B, and
    the diffusion preventing film is made of the second semiconductor material doped with C.

4. The semiconductor device according to claim 3, wherein the second semiconductor material is doped with C at $1 \times 10^{13}$ to $1 \times 10^{16}$ [$cm^{-2}$].

5. The semiconductor device according to claim 1, wherein the diffusion preventing film is made of the second semiconductor material obtained by doping the first semiconductor material with an element preventing diffusion of the second impurity, and the fixed charge layer contains polyatomic ions including the element preventing diffusion of the second impurity.

6. The semiconductor device according to claim 1, wherein the diffusion preventing film is formed of a single-crystalline silicon film doped with C, or a polycrystalline silicon film doped with C.

7. The semiconductor device according to claim 1, wherein the diffusion preventing film has a band gap larger than a band gap of the semiconductor substrate.

8. The semiconductor device according to claim 7, wherein the first semiconductor material is silicon, and
    the second semiconductor material is silicon doped with C, or SiC.

9. A semiconductor device comprising:
    a semiconductor substrate made of a first semiconductor material;
    an element isolation insulating film having a predetermined depth and partitioning a predetermined element formation region of a main surface on one side of the semiconductor substrate;
    a gate electrode film provided through a gate insulating film above the semiconductor substrate within the element formation region and extending in a first direction;
    source/drain regions provided near a surface of the semiconductor substrate respectively on both sides of the gate electrode film in a second direction perpendicular to the first direction, and containing a first impurity of a predetermined conductivity type diffused therein;
    a channel region provided near a surface of the semiconductor substrate below the gate electrode film, and containing a second impurity of a predetermined conductivity type diffused therein; and
    a diffusion preventing film provided at an interface between the element isolation insulating film and the semiconductor substrate, and made of a second semiconductor material different from the first semiconductor material, wherein
    the gate electrode film includes a semiconductor material doped with an N-type impurity,
    the second impurity is B,
    the diffusion preventing film is made of the second semiconductor material doped with C, and
    the fixed charge layer contains carbonate ions.

10. The semiconductor device according to claim 9, wherein the second semiconductor material is doped with C at 1 at % or more.

11. The semiconductor device according to claim 9, wherein the diffusion preventing film is made of the second semiconductor material obtained by doping the first semiconductor material with an element preventing diffusion of the second impurity.

12. The semiconductor device according to claim 9, wherein the gate electrode film includes a semiconductor material doped with an N-type impurity,
    the second impurity is B, and
    the diffusion preventing film is made of the second semiconductor material doped with C.

13. The semiconductor device according to claim 12, wherein the second semiconductor material is doped with C at $1 \times 10^{13}$ to $1 \times 10^{16}$ [$cm^{-2}$].

14. The semiconductor device according to claim 9, further comprising a fixed charge layer provided at an interface between the diffusion preventing film and the element isolation insulating film, wherein the fixed charge layer has a fixed charge of a reverse sign to a fixed charge to be generated in the element isolation insulating film.

15. The semiconductor device according to claim 14, wherein the diffusion preventing film is made of the second semiconductor material obtained by doping the first semiconductor material with an element preventing diffusion of the second impurity, and the fixed charge layer contains polyatomic ions including the element preventing diffusion of the second impurity.

16. The semiconductor device according to claim 14, wherein the diffusion preventing film is formed of a single-crystalline silicon film doped with C, or a polycrystalline silicon film doped with C.

17. The semiconductor device according to claim 9, wherein the diffusion preventing film has a band gap larger than a band gap of the semiconductor substrate.

18. The semiconductor device according to claim 17, wherein the first semiconductor material is silicon, and the second semiconductor material is silicon doped with C, or SiC.

* * * * *